United States Patent
Franco et al.

(10) Patent No.: US 12,009,204 B2
(45) Date of Patent: Jun. 11, 2024

(54) BIAS TEMPERATURE INSTABILITY OF SiO$_2$ LAYERS

(71) Applicant: IMEC VZW, Leuven (BE)

(72) Inventors: Jacopo Franco, Heverlee (BE); Jean-Francois de Marneffe, Bossut-Gottechain (BE); Tibor Grasser, Vienna (AT)

(73) Assignee: IMEC VZW, Leuven (BE)

( * ) Notice: Subject to any disclaimer, the term of this patent is extended or adjusted under 35 U.S.C. 154(b) by 259 days.

(21) Appl. No.: 17/369,709

(22) Filed: Jul. 7, 2021

(65) Prior Publication Data
US 2022/0181145 A1    Jun. 9, 2022

(30) Foreign Application Priority Data
Dec. 4, 2020  (EP) ................................ 20212064

(51) Int. Cl.
H01L 21/02    (2006.01)
(52) U.S. Cl.
CPC .... H01L 21/0234 (2013.01); H01L 21/02164 (2013.01)
(58) Field of Classification Search
None
See application file for complete search history.

(56) References Cited

U.S. PATENT DOCUMENTS

| | | | |
|---|---|---|---|
| 7,157,383 B2 | 1/2007 | Kobayashi | |
| 8,119,461 B2 | 2/2012 | Trentzsch et al. | |
| 8,193,075 B2 | 6/2012 | Xu | |
| 2005/0215070 A1* | 9/2005 | Kobayashi | H01L 29/518 438/770 |
| 2005/0255684 A1* | 11/2005 | Koldiaev | H01L 21/28176 257/E21.654 |
| 2011/0008950 A1* | 1/2011 | Xu | H01L 31/075 257/E21.212 |

FOREIGN PATENT DOCUMENTS

WO    2018091888 A1    5/2018

OTHER PUBLICATIONS

Pobegen et al., "Impact of Hydrogen on the Bias Temperature Instability", Chapter 18, Impact of Hydrogen on the Bias Temperature Instability, Springer Science + Business Media New York 2014, p. 485 (Year: 2014).*
Extended European Search Report and Written Opinion, Application No. EP20212064.8, dated May 28, 2021, 7 pages.
Stegemann, Bert, Andreas Schoepke, Daniel Sixtensson, Benjamin Gorka, Thomas Lussky, and Manfred Schmidt. "Hydrogen passivation of interfacial gap state defects at UHV-prepared ultrathin SiO2 layers on Si (1 1 1), Si (1 1 0), and Si (1 0 0)." Physica E: Low-dimensional Systems and Nanostructures 41, No. 6 (2009): 1019-1024.

(Continued)

*Primary Examiner* — Asok K Sarkar
(74) *Attorney, Agent, or Firm* — McDonnell Boehnen Hulbert & Berghoff LLP

(57) ABSTRACT

A method for improving a bias temperature instability of a SiO$_2$ layer comprises exposing the SiO$_2$ layer to atomic hydrogen.

15 Claims, 12 Drawing Sheets

(56) References Cited

OTHER PUBLICATIONS

Franco, J., Zhicheng Wu, Gerhard Rzepa, Anne Vandooren, H. Arimura, L-Å. Ragnarsson, Geert Hellings et al. "BTI reliability improvement strategies in low thermal budget gate stacks for 3D sequential integration." In 2018 IEEE International Electron Devices Meeting (IEDM), pp. 34-2. IEEE, 2018.

Zhang, Hong, Akira Kumagai, Ge Xu, and Keiji Ishibashi. "Low-temperature atomic hydrogen treatment of SiO2/Si structures." Japanese journal of applied physics 42, No. 10R (2003): 6252.

Franco, J., J-F. de Marneffe, A. Vandooren, Y. Kimura, L. Nyns, Z. Wu, A-M. El Sayed et al. "Atomic Hydrogen Exposure to Enable High-Quality Low-Temperature SiO 2 with Excellent pMOS NBTI Reliability Compatible with 3D Sequential Tier Stacking." In 2020 IEEE International Electron Devices Meeting (IEDM), pp. 31-32. IEEE, 2020.

Yue, Yunliang, Jianwei Wang, Yuqi Zhang, Yu Song, and Xu Zuo. "Interactions of atomic hydrogen with amorphous SiO2." Physica B: Condensed Matter 533 (2018): 5-11.

Stahlbush, R. E., and E. Cartier. "Interface defect formation in MOSFETs by atomic hydrogen exposure." IEEE transactions on nuclear science 41, No. 6 (1994): 1844-1853.

Wimmer, Yannick, Al-Moatasem El-Sayed, Wolfgang Gös, Tibor Grasser, and Alexander L. Shluger. "Role of hydrogen in volatile behaviour of defects in SiO2-based electronic devices." Proceedings of the Royal Society A: Mathematical, Physical and Engineering Sciences 472, No. 2190 (2016): 20160009.

Rzepa, Gerhard, Jacopo Franco, B. O'Sullivan, A. Subirats, Marco Simicic, Geert Hellings, Pieter Weckx et al. "Comphy—A compact-physics framework for unified modeling of BTI." Microelectronics Reliability 85 (2018): 49-65.

San Andrés, E., A. Del Prado, F. L. Martinez, I. Mártil, D. Bravo, and F. J. López. "Rapid thermal annealing effects on the structural properties and density of defects in SiO 2 and SiN x: H films deposited by electron cyclotron resonance." Journal of Applied Physics 87, No. 3 (2000): 1187-1192.

Grasser, Tibor, M. Waltl, Wolfgang Gös, Yannick Wimmer, A-M. El-Sayed, Alexander L. Shluger, and Ben Kaczer. "On the volatility of oxide defects: Activation, deactivation, and transformation." In 2015 IEEE International Reliability Physics Symposium, pp. 5A-3. IEEE, 2015.

Deal, Bruce E., Maija Sklar, Andrew S. Grove, and Edward H. Snow. "Characteristics of the surface-state charge (Qss) of thermally oxidized silicon." Journal of the Electrochemical Society 114, No. 3 (1967): 266.

\* cited by examiner

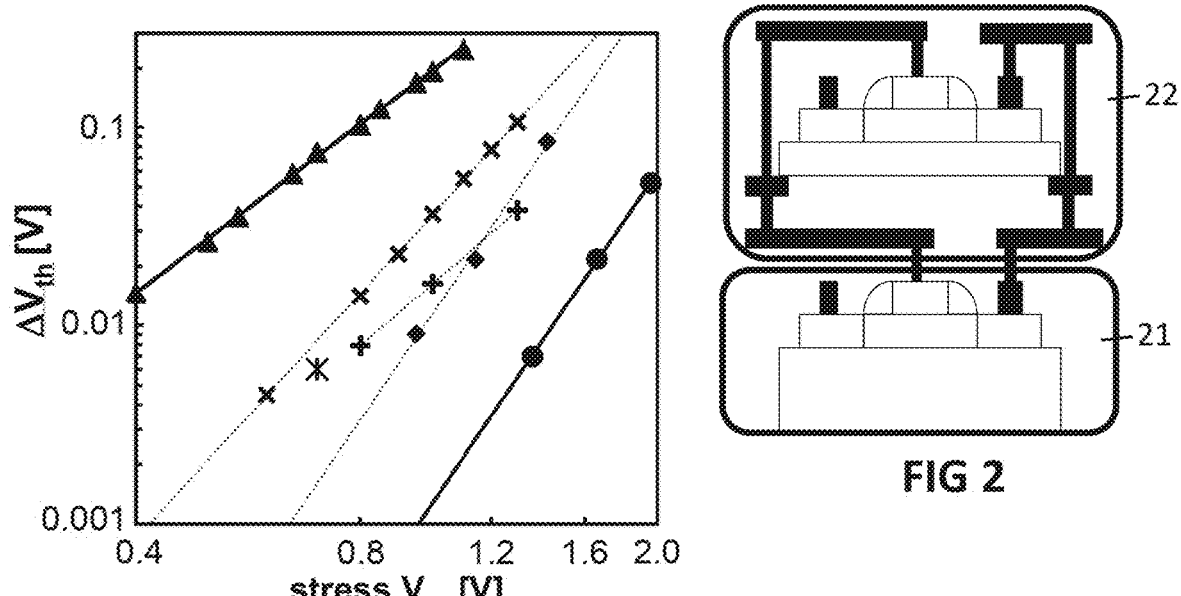
FIG 1
FIG 2
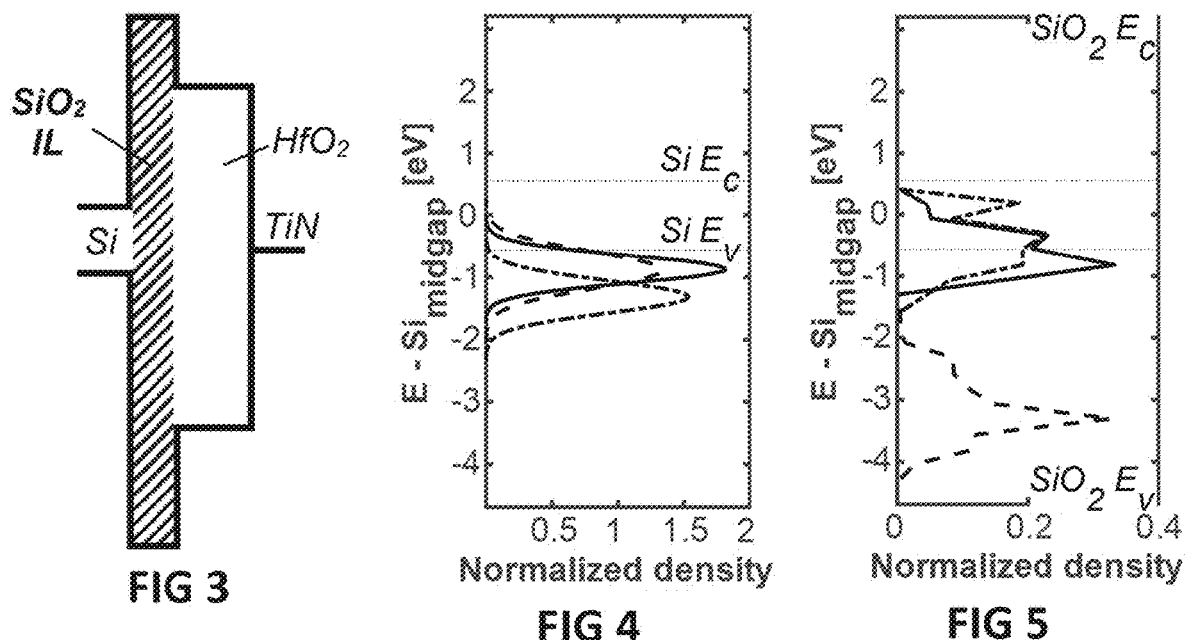
FIG 3
FIG 4
FIG 5
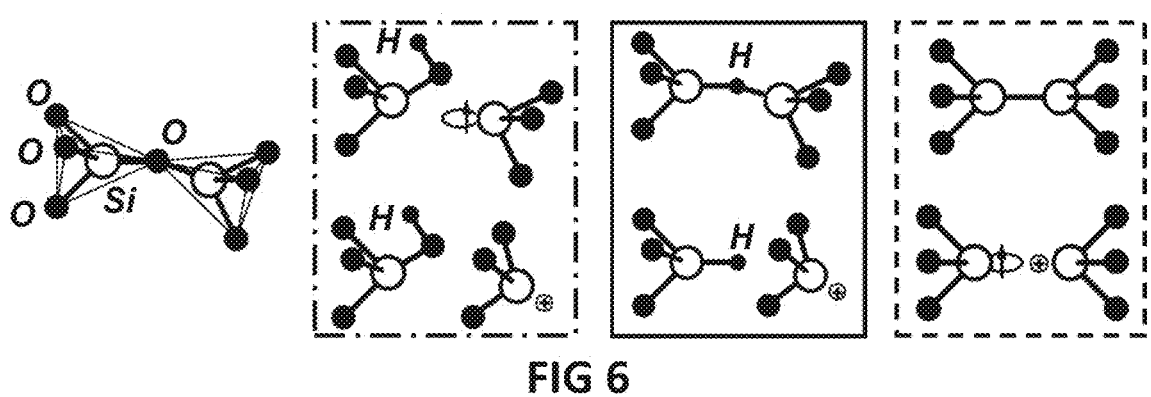
FIG 6

BIAS TEMPERATURE INSTABILITY OF SiO$_2$ LAYERS

CROSS-REFERENCE TO RELATED APPLICATIONS

The present application is a non-provisional patent application claiming priority to European Patent Application No. 20212064.8, filed Dec. 4, 2020, the contents of which are hereby incorporated by reference.

FIELD OF THE DISCLOSURE

This application relates to semiconductor structures-especially metal-oxide-semiconductor structures-comprising SiO$_2$ layers. In particular, this application relates to such structures in which bias temperature instability is a concern.

BACKGROUND

Metal-oxide-semiconductor (MOS) structures-such as field-effect transistors (FETs) and capacitors-used in standard CMOS (complementary metal-oxide-semiconductor) technology, exhibit undesirable bias temperature instability (BTI) of their electrical characteristics. This can be attributed to the presence of electrically active defects in the dielectric stack, which can trap/de-trap channel carriers and affect the device electrostatics and carrier transport in the channel, inducing performance degradation. For example, the presence of hole traps is known to induce NBTI (negative BTI) in native SiO2, the latter being also used as an interfacial layer in contemporary high-k metal gate (HKMG) technologies. Hole trap density in SiO2 is minimized in commercial technologies by either (1) forming the SiO2 layer at elevated temperature (e.g., rapid thermal oxidation at 900+° C.), or (2) exposing the SiO2 layer to the source/drain doping activation anneal at 1000+° C., or (3) applying rapid thermal anneals in a so-called 'reliability anneal' (e.g., >800° C. for 1-2 s) after the dielectric stack deposition, even in a replacement metal gate (RMG) process flow. By contrast, Franco et al. (2018) have shown that omission of the reliability anneal results in very poor NBTI (results reproduced in FIG. 1) and PBTI (positive BTI) reliability of a RMG HKMG stack (FRANCO, J., et al. BTI reliability improvement strategies in low thermal budget gate stacks for 3D sequential integration. In: 2018 IEEE International Electron Devices Meeting (IEDM). IEEE, 2018. p. 34.2. 1-34.2. 4.); thereby illustrating the extreme sensitivity to fabrication temperature of the gate stack reliability.

Thermal-budget limitations in advanced technologies, however, impede the use of high-temperature fabrication steps. For example, stacking of multiple semiconductor device tiers in a sequential 3D integration flow has been demonstrated as a promising approach to continue increasing CMOS functionality per die area. Yet, to maintain the functionality of the lower tiers, a reduced thermal budget is available to form the higher tiers. A different approach is, therefore, needed to improve the BTI in such a context.

Franco et al. (2018; cf. supra) demonstrated sufficient nMOS (n-type MOS) PBTI reliability at a low thermal budget by inserting dipole-forming layers at the SiO2-HfO2 interface to induce a more favorable line-up between the HfO2 and Si band edges resulting in less charge trapping. Such an approach was also useful for pMOS (p-type MOS) NBTI, but only if the SiO$_2$ interlayer (IL) was aggressively scaled down (<0.7 nm). By contrast, for a ~1-1.2 nm interlayer-still of relevance for the current state-of-the-art technology-excessive hole trapping in the low temperature SiO$_2$ represented the limiting factor for NBTI reliability.

At IEEE SISC 2019, Franco et al. presented that post-metal anneals at reduced temperature (<600° C.) can reduce the charging trap density in HfO2; however, the same approach was ineffective for SiO$_2$ hole traps.

There is thus still a need in the art for better approaches to improve BTI—and especially NBTI—of SiO$_2$ layers using a reduced thermal budget.

SUMMARY

An aspect of the application provides suitable methods for improving bias temperature instability of a SiO$_2$ layer. A further aspect provides suitable uses and products associated therewith. These aspects are accomplished by methods, uses, and SiO$_2$ layers that are described herein.

In example embodiments, the bias temperature instability—and especially the negative bias temperature instability—of a SiO$_2$ layer can be improved.

In example embodiments, electrically active defects—such as hydroxyl-E' and/or hydrogen bridge defects—are effectively passivated. In example embodiments, dangling bonds (Pb)—which could in some cases be formed as a side-effect of the atomic hydrogen (H*) treatment—can be (re-)passivated using a subsequent molecular hydrogen (H$_2$) treatment; e.g., performed directly after the H* exposure and/or later in the process flow (e.g., at the end of the RMG flow).

In example embodiments, charge in the SiO$_2$ layer (e.g., positive oxide charge) is reduced.

In example embodiments, they are independent of the way in which the SiO$_2$ layer was formed (e.g., thermal or chemical oxidation).

In example embodiments, they are independent of the temperature at which the SiO$_2$ layer was formed or had previously been treated; e.g., even though the bias temperature instability of SiO$_2$ layers formed at high temperature (e.g., ~900° C.) or subjected to reliability anneal are inherently already better, these can still be further improved using an atomic hydrogen treatment disclosed herein.

In example embodiments, the atomic hydrogen can be performed at a relatively low temperature (e.g., compared to a reliability anneal). The abovementioned notwithstanding, in example embodiments, they are particularly beneficial in situations where the thermal budget must be minimized, as no other effective solution for improving the bias temperature instability of the SiO$_2$ layer has hereto been formulated in that context.

Without being bound by theory, the inventors presently discovered that the electrically active defects which contribute to bias temperature instability—and especially NBTI—in SiO$_2$ can predominantly be traced back to hydroxyl-E' defects. Furthermore—as will be discussed in detail below—it was surprisingly found that exposure of the SiO$_2$ to atomic hydrogen can be used to effectively render such defects electrically inactive, thereby considerably improving the BTI of the SiO$_2$ layer. This treatment can be performed at relatively low temperatures (e.g., between 100° C. and 300° C.) and has a particularly strong effect on SiO$_2$ layers formed at low temperatures; thereby yielding a potent approach for situations where a low thermal budget should be adhered to. The aforementioned notwithstanding, it was, however, found that the atomic hydrogen treatment is also effective on SiO$_2$ layers formed at high temperature (e.g., ~900° C.); the aspects, therefore, are thus not limited to low temperature scenarios.

A first aspect relates to a method for improving a bias temperature instability of a $SiO_2$ layer, comprising: (a) exposing the $SiO_2$ layer to atomic hydrogen.

A second aspect relates to a method for forming a $SiO_2$ layer for a metal-oxide-semiconductor, comprising: depositing a $SiO_2$ layer, and improving a bias temperature instability of a $SiO_2$ layer using the method according to any embodiment of the first aspect.

A third aspect relates to the use of atomic hydrogen for improving a bias temperature instability of a $SiO_2$ layer.

A fourth aspect relates to a $SiO_2$ layer obtainable by the method according to any embodiment of the first aspect.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, and features will become apparent from the following detailed description, taken in conjunction with the accompanying drawings, which illustrate, by way of example, various principles. This description is given for the sake of example only, without limiting the scope of the claims. The reference figures quoted below refer to the attached drawings.

BRIEF DESCRIPTION OF THE FIGURES

The above, as well as additional features, will be better understood through the following illustrative and non-limiting detailed description of example embodiments, with reference to the appended drawings.

FIG. 1 is a graph showing a comparison of the measured NBTI-induced $\Delta V_{th}$, in accordance with example embodiments.

FIG. 2 is a schematic depiction of stacked transistors in a sequential 3D integration, in accordance with example embodiments.

FIG. 3 is a schematic diagram of the band levels of a $Si/SiO_2/HfO_2/TiN$ stack, in accordance with example embodiments.

FIG. 4 is a graph of the probability density functions of the hole trap levels in the $SiO_2$ IL, in accordance with example embodiments.

FIG. 5 is a graph showing ab-initio statistical calculations of hydroxyl-E' (long dash-short dash), hydrogen bridge (solid) and oxygen vacancy (dash) charge transition levels, in accordance with example embodiments.

FIG. 6 is a schematic depiction of a regular defect-free tetrahedral $SiO_2$ configuration (left), and neutral (top row) and positive stable (bottom row) configurations of hydroxyl-E' (dash-dot), hydrogen bridge (solid) and oxygen vacancy (dash) microscopic defect structures, in accordance with example embodiments.

Figure 7:
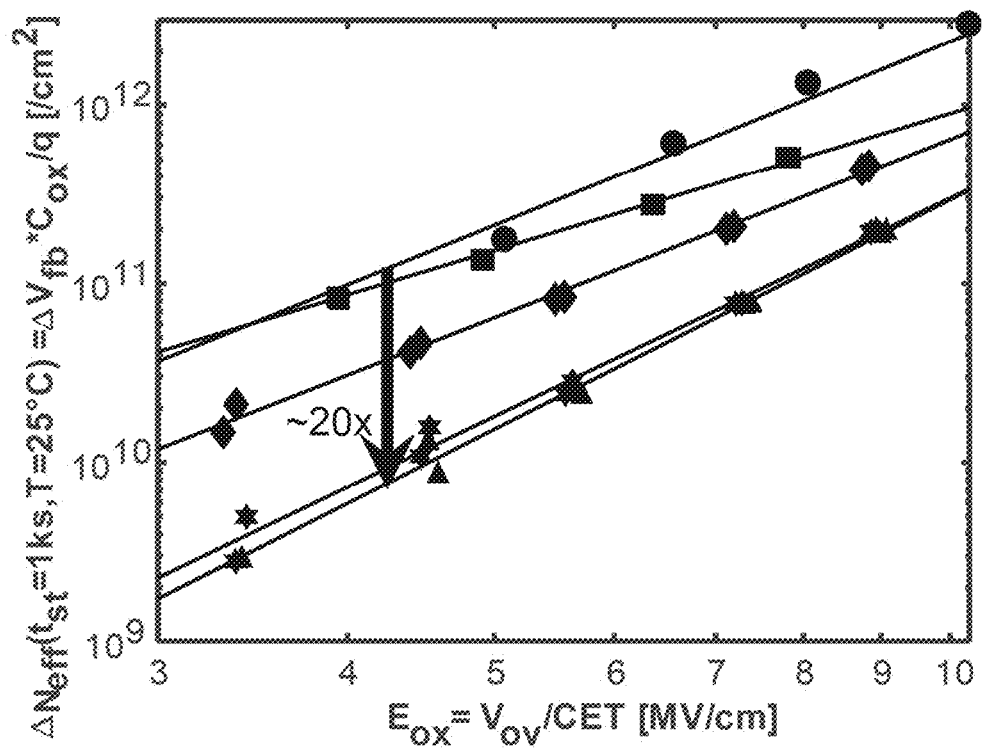
FIG. 7 is a graph showing the effective NBTI-induced trapped charge sheet density $\Delta N_{eff}$, in accordance with example embodiments.

In the different figures, the same reference signs refer to the same or analogous elements. All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Furthermore, the terms first, second, third and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable with their antonyms under appropriate circumstances and that the embodiments described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps or components, or groups thereof. The term "comprising," therefore, covers the situation where only the stated features are present and the situation where these features and one or more other features are present. Thus, the scope of the expression "a device comprising means A and B" should not be interpreted as being limited to devices consisting only of components A and B.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claims require more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some, but not other features included in other embodiments, combinations of features of different embodiments are meant to be within the scope of the claims, and form different embodiments, as would be understood by those in the art. For example, in the following claims, any of the claimed embodiments can be used in any combination.

In the description provided herein, numerous specific details are set forth. However, it is understood that the embodiments may be practiced without these specific details. In other instances, well-known methods, structures, and techniques have not been shown in detail in order not to obscure an understanding of this description.

The following terms are provided solely to aid in the understanding of the disclosure.

As used herein, and unless otherwise specified, atomic hydrogen (H*) refers to the neutral radical of the chemical element hydrogen. Atomic hydrogen is also known under its IUPAC (International Union of Pure and Applied Chemistry) systematic name of 'monohydrogen.'

As used herein, and unless otherwise specified, bias temperatures instability (BTI) is a type of metal-oxide-semiconductor structure (e.g., transistor or capacitor) aging that has a negative effect on the performance characteristics of the MOS structure. The degradation may, for example, typically manifest as an increasing threshold voltage over time. Depending on the (gate) bias voltage under which the BTI manifests, one can distinguish negative (NBTI) or positive (PBTI) BTI. NBTI is typically of most concern for pMOS, while PBTI is typically of most concern for nMOS. However, —more generally—this can differ depending on the operating mode (e.g., bias regime) of the semiconductor structure. (N)BTI can, for instance, be studied by stress/recovery sequences during which the effective trapped charge sheet density $\Delta N_{eff}$ can be determined from the threshold voltage (transistor) or flatband voltage (capacitor) shift measured for increasing stress $E_{ox}$ (cf. Example).

A first aspect relates to a method for improving a bias temperature instability of a $SiO_2$ layer, comprising: (a) exposing the $SiO_2$ layer to atomic hydrogen.

In example embodiments, the bias temperature instability may be a negative bias temperature instability. Although aspects disclosed herein can, in general, improve both the NBTI and PBTI of the $SiO_2$ layer—compared to NBTI, which is typically dominated by hole traps—PBTI is typically sensitive to electron traps in a different energy range of the dielectric (more particularly, above the Si conduction band). $SiO_2$ tends to inherently have a relatively low trap density at those energies, so that any improvement brought to PBTI through the present atomic hydrogen treatment is comparatively typically lower than for NBTI.

In embodiments, the step calling for exposing the $SiO_2$ layer to atomic hydrogen may be performed at a temperature between 60 and 750° C., between 75 and 600° C., between 85 and 450° C., and between 100 and 300° C. In embodiments, the step calling for exposing the $SiO_2$ layer to atomic hydrogen may be performed for a duration of between 1 s and 120 min, between 2 s and 60 min, between 5 s and 30 min, between 7 s and 15 min, and between 10 s and 10 min.

In embodiments, the step calling for exposing the $SiO_2$ layer to atomic hydrogen may comprise exposing the $SiO_2$ layer to atomic hydrogen from a remote plasma. A remote plasma allows exposure to the $SiO_2$ layer—through the plasma afterglow—to atomic hydrogen, without directly subjecting the $SiO_2$ to the plasma as such. By contrast, a direct plasma may cause bombardment on and, therefore, deterioration of the $SiO_2$ layer. Moreover, in a remote plasma setup, the temperature of the substrate (e.g., wafer) during the exposure treatment can be controlled independently.

In embodiments, the method may comprise a further step-before the step calling for exposing the $SiO_2$ layer to atomic hydrogen—of: growing the $SiO_2$ layer at a temperature of 750° C. or lower, 700° C. or lower, 650° C. or lower, or 600° C. or lower. In embodiments, the $SiO_2$ layer may be grown using a thermal or chemical oxidation.

In embodiments, the $SiO_2$ layer may not have been exposed to a temperature of more than 900° C., more than 800° C., than 700° C., more than 600° C., or more than 300° C. For example, the $SiO_2$ layer may be grown using a thermal oxidation at 600° C. or lower, or by chemical oxidation at 300° C. or lower. In embodiments, the $SiO_2$ layer may not have been exposed to such temperatures before the step calling for exposing the $SiO_2$ layer to atomic hydrogen. For example, the $SiO_2$ layer may have been formed at a relatively low temperature (e.g., ~600° C.) and may not have been exposed to a so-called 'reliability anneal' (typically performed at temperatures of about 850° C.-900° C.). Such layers which have not 'seen' such a relatively high temperature typically comprise more defects that contribute to a higher bias temperature instability, so that an atomic hydrogen treatment may in those case have comparatively more effect. In embodiments, the $SiO_2$ layer may not have been exposed to such temperatures before, during, and after the step calling for exposing the $SiO_2$ layer to atomic hydrogen. Not exposing the $SiO_2$ layer at any point to a high temperature is very attractive for applications in which the available thermal budget is a concern (e.g., as in sequential 3D integration).

In embodiments, the method may comprise a further step-after the step calling for exposing the $SiO_2$ layer to atomic hydrogen—of sintering the $SiO_2$ layer in the presence of molecular hydrogen ($H_2$). Without being bound by theory, it has been observed that atomic hydrogen can sometimes induce interface quality degradation by de-passivation of Si—H bonds (e.g., at the interface between the Si crystal surface and the $SiO_2$). This can dampen the positive effect of the atomic hydrogen treatment that is observed on the bias temperature instability. However, a standard 'short sintering anneal'—which is already routinely performed in RMG process flows—can easily remove this dampening and restore the full effect. In embodiments, the step calling for sintering the $SiO_2$ layer in the presence of $H_2$ may be performed directly after the step calling for exposing the $SiO_2$ layer to atomic hydrogen and/or later in the process flow (e.g., at the end of the RMG process flow). For example, the $SiO_2$ layer may be sintered in the presence of $H_2$ immediately after the step calling for exposing the $SiO_2$ layer to atomic hydrogen, and a short sintering anneal in the presence of $H_2$ may be performed at the end of the RMG process flow. In embodiments, the molecular hydrogen may be provided in the form of $H_2$ as such (e.g., $H_2$ gas) or forming gas (a mixture of $H_2$ and $N_2$).

In embodiments, the step calling for sintering the $SiO_2$ layer in the presence of $H_2$ may be performed at a temperature between 200 and 600° C., or between 300 and 500° C., such as 400° C. In embodiments, the step calling for sintering the $SiO_2$ layer in the presence of $H_2$ may be performed for a duration of between 2 and 120 min, 5 and 60 min, 10 and 30 min, or 15 and 25 min, such as 20 min.

In embodiments, the $SiO_2$ layer may have a thickness below 10 nm, 5 nm, 3 nm, or between 0.5 and 2.5 nm. For example, the $SiO_2$ layer may have a thickness of 0.6 nm, 1.2 nm, or 2.2 nm.

In embodiments, any feature of any embodiment of the first aspect may independently be as correspondingly described for any embodiment of any of the other aspects.

A second aspect relates to a method for forming a $SiO_2$ layer for a metal-oxide-semiconductor, comprising: (a) depositing a $SiO_2$ layer, and (b) improving a bias temperature instability of a $SiO_2$ layer using the method according to any embodiment of the first aspect.

In embodiments, the metal-oxide-semiconductor may be a metal-oxide-transistor or a metal-oxide capacitor, and in an example, a metal oxide transistor. In embodiments, the $SiO_2$ layer may be a $SiO_2$ interlayer for the metal-oxide semiconductor.

In embodiments, the metal-oxide-semiconductor may be a p-type metal-oxide-semiconductor. NBTI tends to affect pMOS more than nMOS, so that a larger benefit will typically be observed for pMOS (cf. supra).

In embodiments, the method may be for improving a bias temperature instability of the $SiO_2$ layer during a sequential 3D integration process.

In embodiments, any feature of any embodiment of the second aspect may independently be as correspondingly described for any embodiment of any of the other aspects.

A third aspect relates to the use of atomic hydrogen for improving a bias temperature instability of a $SiO_2$ layer.

In embodiments, the bias temperature instability may be a negative bias temperature instability.

In embodiments, any feature of any embodiment of the third aspect may independently be as correspondingly described for any embodiment of any of the other aspects.

A fourth aspect relates to a $SiO_2$ layer obtainable by the method according to any embodiment of the first aspect.

In embodiments, the effective trapped charge sheet density $\Delta N_{eff}$ (see e.g., Example) of such a $SiO_2$ layer—measured after a stress time $t_{stress}$ of 1 ks with a sense delay $t_{delay}$ of 10 ms at a temperature T of 25° C. for a stress $E_{ox}$ of 5 MV/cm—may be equal to $1\times10^{10}/cm^2$ or lower, $7\times10^9/cm^2$ or lower, $5\times10^9/cm^2$ or lower, $2\times10^9/cm^2$ or lower, or $1\times10^9/cm^2$ or lower.

In embodiments, any feature of any embodiment of the fourth aspect may independently be as correspondingly described for any embodiment of any of the other aspects.

A detailed description of several example embodiments is provided below. It is clear that other embodiments can be configured according to the knowledge of the person skilled in the art without departing from the true technical teaching herein. The following description of the figures is provided to elucidate various aspects of the example embodiments.

FIG. 1 is a graph showing a comparison of the measured NBTI-induced $\Delta V_{th}$ for increasing stress $V_{ov}$ (T=125° C., $t_{stress}$=1 ks and $t_{delay}$=~1 ms) in Si RMG HKMG for different SiO$_2$ interlayers, namely: an as grown ~0.7 nm chemical oxide (triangle), an equivalent chemical oxide further exposed after HKMG to an 850° C. 'reliability anneal' (cross), an interlayer as featured in a commercial Foundry 28 nm process cf. Franco et al. (2018) (plus), an equivalent chemical oxide exposed before HKMG to H* for 10" (10 s) at 300° C. in accordance with an example embodiment (diamond), and a ~1.2 nm thermal oxide grown at 600° C. and exposed before HKMG to H* at 300° C. for 10' (10 min) in accordance with an example embodiment (circle). A desired target performance is also marked in FIG. 1 (asterisk). Omitting the reliability anneal—e.g., for thermal compatibility in sequential 3D integration-results in a reliability penalty w.r.t. the Foundry 28 nm sample, which is overcome by (low temperature) atomic H exposure. The latter moreover greatly exceeds the desired target performance.

FIG. 2 is a schematic depiction of stacked transistors in a sequential 3D integration, comprising a first (lower) tier (21) and a second (top) tier (22).

FIG. 3 is a schematic diagram of the band levels of a Si/SiO$_2$/HfO$_2$/TiN stack.

FIG. 4 is a graph of the probability density functions of the hole trap levels in the SiO$_2$ IL—as estimated by modeling the NBTI transients recorded on the as-deposited gate stack with the Non-Radiative Multi-Phonon theory-, as deposited with a 5 nm TiN layer (solid), after a post-metal anneal at 525° C. for 2 h (dash), and after a typical 'reliability anneal'(~900° C. in He) (long dash-short dash).

FIG. 5 is a graph showing—for comparison with FIG. 4—ab-initio statistical calculations of hydroxyl-E' (long dash-short dash), hydrogen bridge (solid) and oxygen vacancy (dash) charge transition levels. The hole trap levels in the SiO$_2$ IL (FIG. 4) compare well with the levels calculated for hydroxyl-E' and hydrogen bridge, but not with the deep levels calculated for the oxygen vacancies.

FIG. 6 is a schematic depiction of a regular defect-free tetrahedral SiO$_2$ configuration (left), and neutral (top row) and positive stable (bottom row) configurations of hydroxyl-E' (dash-dot), hydrogen bridge (solid), and oxygen vacancy (dash) microscopic defect structures.

FIG. 7 is a graph showing the effective NBTI-induced trapped charge sheet density $\Delta N_{eff}$ measured for increasing stress $E_{ox}$($t_{stress}$=1 ks, T=25° C. to expose mainly the trapping component) on RMG HKMG stacks with different IL's: a chemical oxide (~0.7 nm) (circle), three thermal oxides (~1.2 nm) grown at 600 (square), 700 (diamond) and 900 (star) ° C., an equivalent 700° C. thermal oxide that was further exposed after HKMG to a post-metal 850° C. 'reliability anneal'(triangle).

Figure 8:
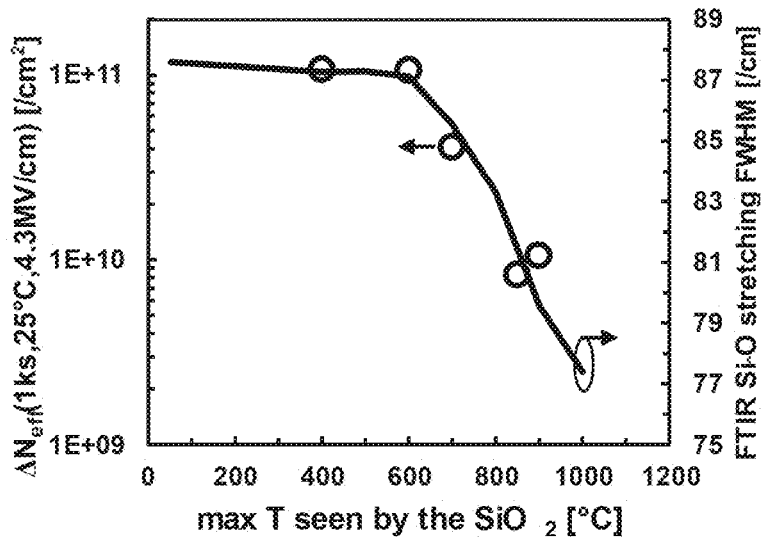
FIG. 8 is a graph of the trapped charge, in accordance with example embodiments.

FIG. 8 is a graph of the trapped charge density ($\Delta N_{eff}$ at $E_{ox}$=4.3 MV/cm, cf. FIG. 7) plotted as a function of the highest temperature seen by the IL during fabrication. The notable drop above 600° C. compares well with the drop in Si—O bond stretching (line) reported by San Andrés et al. (cf. infra).

Figure 9:
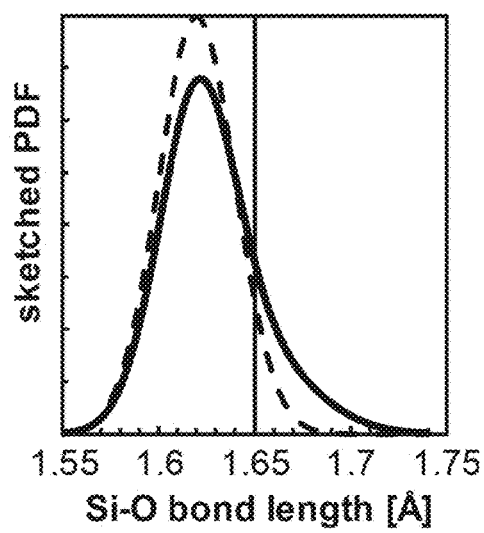
FIG. 9 is a sketched graph of the probability density function (PDF) of Si—O bonds, in accordance with example embodiments.

FIG. 9 is a sketched graph of the probability density function (PDF) of Si—O bonds as a function of their length for SiO$_2$ formed at low (solid) and high (dashed) temperatures. Si—O bonds stretched beyond ~1.65 Å can form hydroxyl-E' defects and the fraction of stretched Si—O bonds is larger in a low temperature oxide, e.g., due to unrelaxed interface strain.

Figure 10:
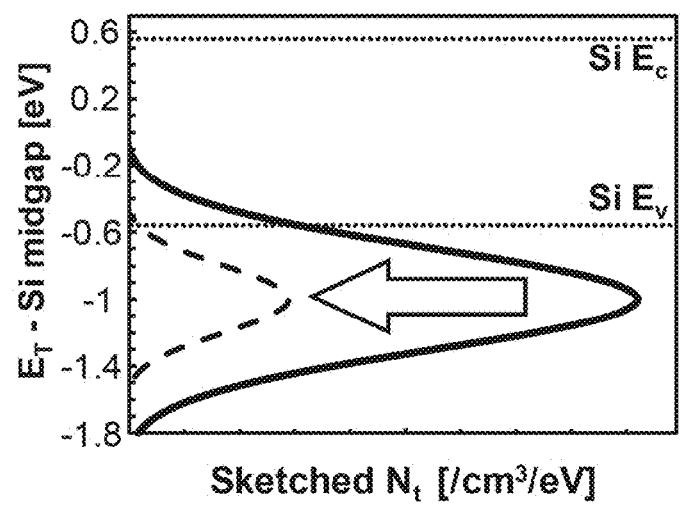
FIG. 10 is a sketched graph of the hole trap density $N_t$ before (solid) and after (dashed) increased oxidation temperature, or H* treatment in accordance with example embodiments.

FIG. 10 is a sketched graph of the hole trap density $N_t$ before (solid) and after (dashed) increased oxidation temperature, or H* treatment in accordance with an example embodiment. The tail end of the hole trap defect band extends above the Si valence band edge ($E_v$), resulting in a (large) positive oxide charge density, but can be suppressed at low temperatures by a hydrogen treatment in accordance with an example embodiment.

Figure 11:
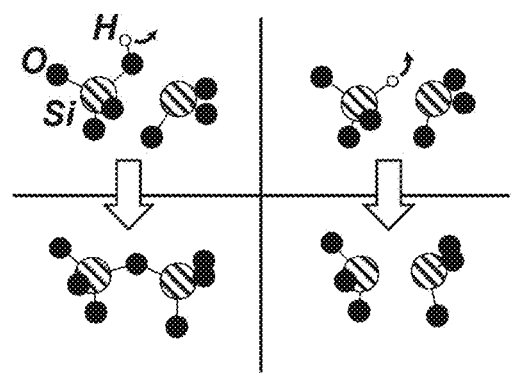
FIG. 11 is a diagram of the effect of hydrogen removal on hydroxyl-E' (top left) and hydrogen bridge (top right) defects, in accordance with example embodiments.

FIG. 11 is a diagram of the effect of hydrogen removal on hydroxyl-E' (top left) and hydrogen bridge (top right) defects. By removing the sticking hydrogen atom, the hydroxyl-E' would tend to reform a correct (i.e., defect free) Si—O—Si configuration (bottom left), while the hydrogen bridge would transform into an oxygen vacancy (bottom right), with transition level too deep for charging at operating voltages, cf. FIG. 4-FIG. 6. As such, both hydroxyl-E' and hydrogen bridge passivation by an incoming additional hydrogen atom, or removal of the sticking hydrogen by dimerization with an incoming additional hydrogen atom are expected to render the defect site electrically inactive at the operating voltage range.

Figure 12:
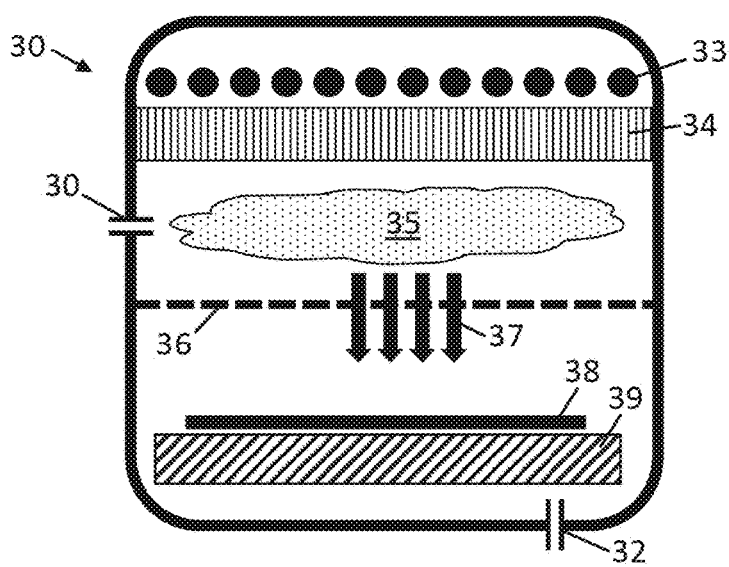
FIG. 12 is a schematic illustration of a remote plasma setup, in accordance with example embodiments.

FIG. 12 is a schematic illustration of a remote plasma setup (e.g., developed on a 300 mm commercial etch tool) to expose the IL to hydrogen radicals at a desired (low) temperature. Depicted are a chamber 30 with a gas inlet 31, a pump 32, plasma coils 33 and transformer coupled plasma (TCP) window 34 for forming a (remote) plasma 35. Through a grid 36, a radical flow 37—such as atomic hydrogen—of the plasma 35 is used to expose a (heated) substrate 38 on a sample holder 39.

Figure 13:
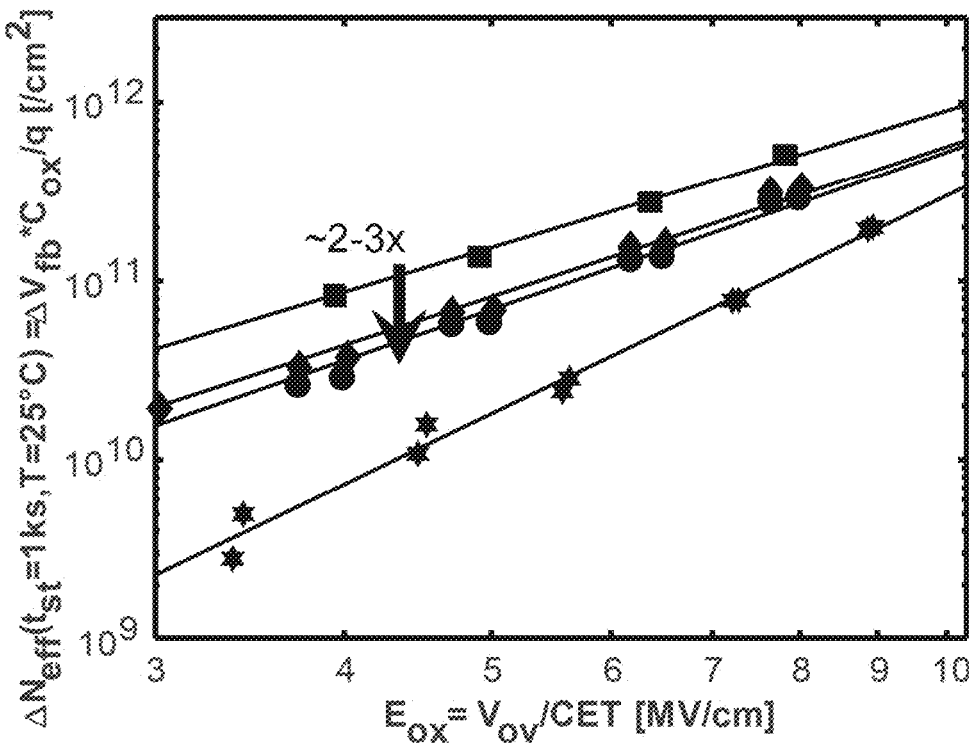
FIG. 13 is a graph showing the effective NBTI-induced trapped charge sheet density $\Delta N_{eff}$, in accordance with example embodiments.

FIG. 13 is a graph showing the effective NBTI-induced trapped charge sheet density $\Delta N_{eff}$ measured for increasing stress $E_{ox}$($t_{stress}$=1 ks, T=25° C. to expose mainly the trapping component) on RMG HKMG stacks with different IL's: two thermal oxides (~1.2 nm) grown at 600 (square) and 900 (star) ° C., and two equivalent 600° C. thermal oxides that was further exposed before HKMG to a high pressure (20 atm) anneal at 450° C. in molecular H$_2$ for 0.5 (diamond) and 2 (circle) h. Exposing the 600° C. IL to high-pressure molecular H$_2$ results only in a 2-3× reduction of the NBTI-induced $\Delta N_{eff}$ i.e., not enough to match the reliability of the reference stack based on a 900° C. IL.

Figure 14:
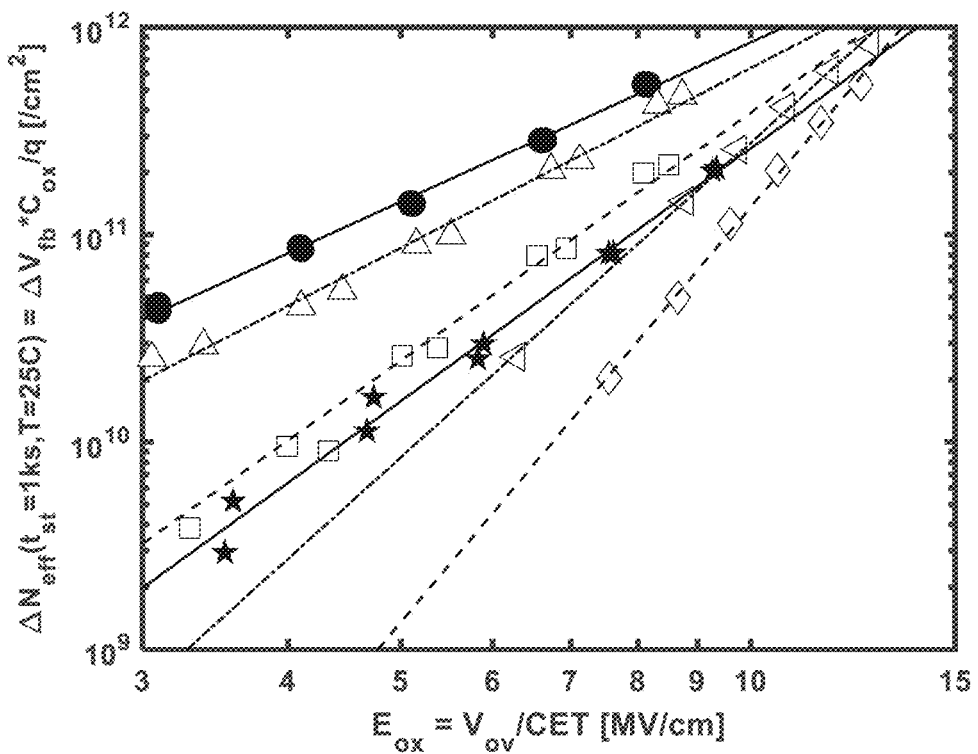
FIG. 14 is another graph showing the effective NBTI-induced trapped charge sheet density $\Delta N_{eff}$, in accordance with example embodiments.

FIG. 14 is a graph showing the effective NBTI-induced trapped charge sheet density $\Delta N_{eff}$ measured for increasing stress $E_{ox}$($t_{stress}$=1 ks, T=25° C. to expose mainly the trapping component) on RMG HKMG stacks with different IL's: two thermal oxides (~1.2 nm) grown at 600 (circle) and 900 (star) ° C., and four equivalent 600° C. thermal oxides that were further exposed before HKMG to H* respectively at 100° C. for 10" (triangle pointing up), at 300° C. for 10" (square), at 100° C. for 10' (triangle pointing left) and at 300° C. for 10' (diamond). Exposure to H* results in a dramatic reduction (up to ~20× for 100° C. and ~100× for 300° C.) of the NBTI-induced $\Delta N_{eff}$ (T=25° C.). The reference stack based on a 900° C. IL can be matched or surpassed with a 10' exposure.

Figure 15:
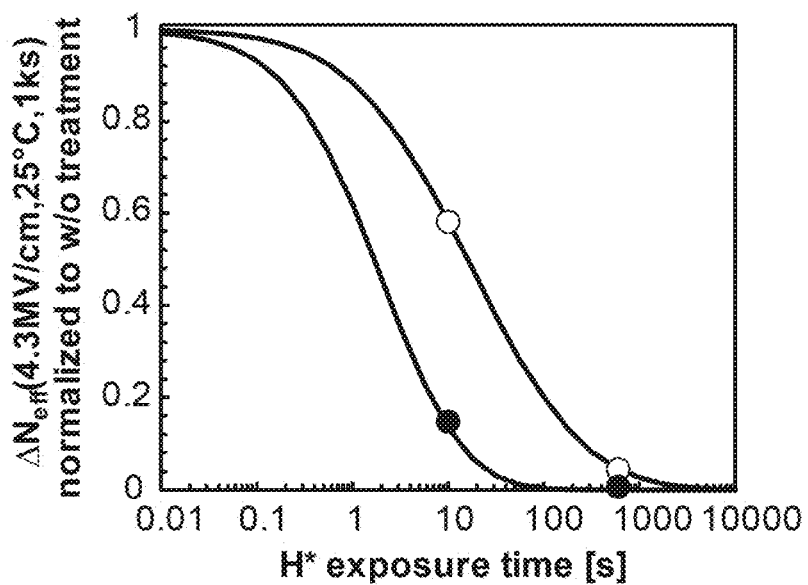
FIG. 15 is a graph showing $\Delta N_{eff}$ reduction factors for H* exposures, in accordance with example embodiments.

FIG. 15 is a graph showing $\Delta N_{eff}$ reduction factors for H* exposures at 100 (hollow circle) and 300 (full circle) ° C., modeled (lines) as a first-order reaction using $$\sum_{i=1}^{n}\left(\exp\left(\frac{-t_{H^*}}{\tau_0 \cdot \exp\left(\frac{E_a i}{k_B T}\right)}\right)\right)/n$$

yielding a (low) activation energy $E_a$ of ~0.21 eV (μ=0.21 eV, σ=0.06 eV) with $\tau_0$=38 ms.

Figure 16:
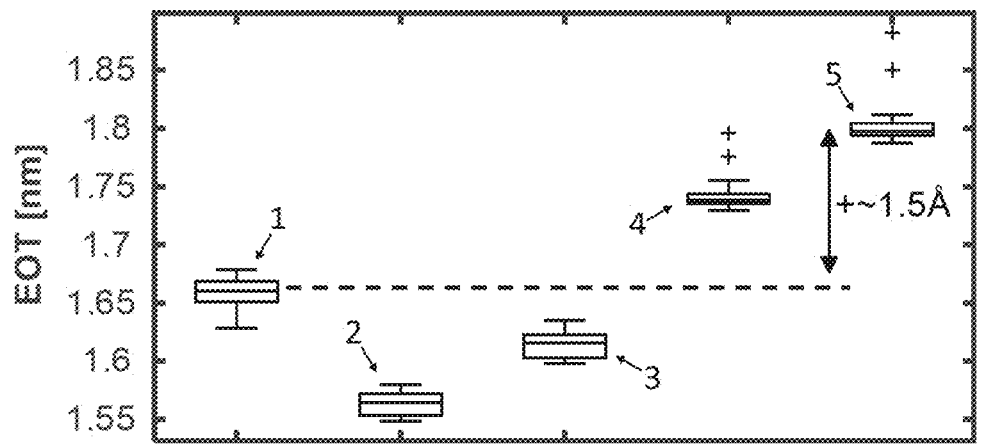
FIG. 16 is a box plot showing the EOT of the final stack for different H* exposures, in accordance with example embodiments.
Figure 23:
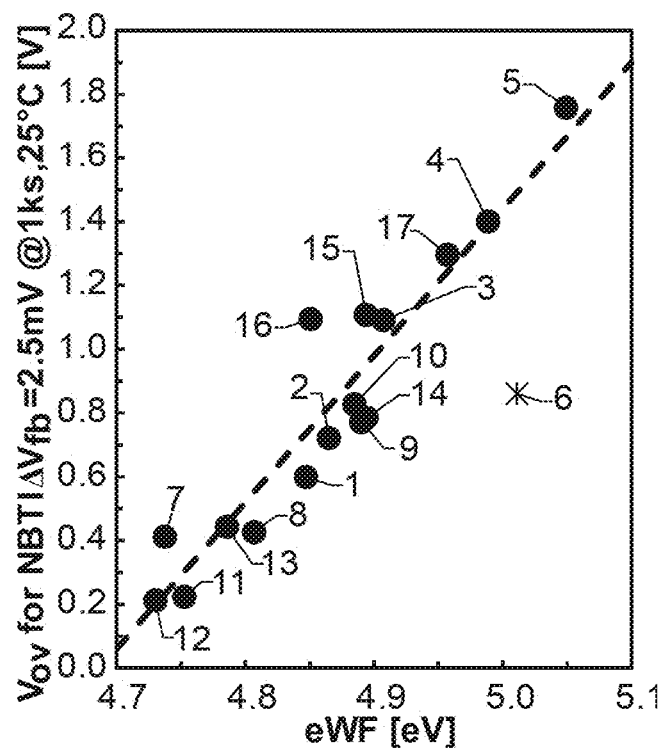
FIG. 23 is a correlation plot of NBTI reliability vs. the eWF for gate stacks with different, in accordance with example embodiments.

FIG. 16 is a box plot showing the EOT of the final stack for different H* exposures on the IL, with reference numbers as for FIG. 23. A marginal EOT increase (1-1.5 Å) is observed for the 10' exposures, but can be suppressed using a subsequent $H_2$ anneal.

Figure 17:
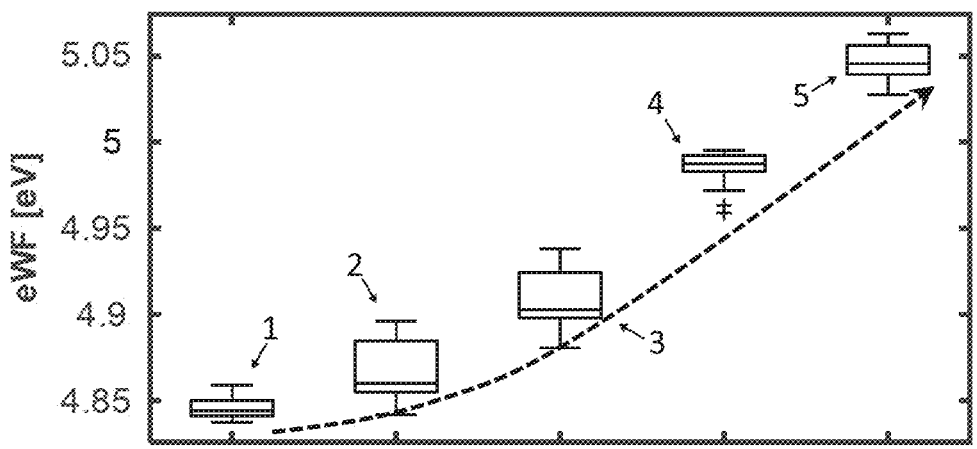
FIG. 17 is a box plot showing the eWF of the final stack for different H* exposures, in accordance with example embodiments.

FIG. 17 is a box plot showing the eWF of the final stack for different H* exposures on the IL, with reference numbers as for FIG. 23. A gradual increase of the eWF is consistently observed.

Figure 18:
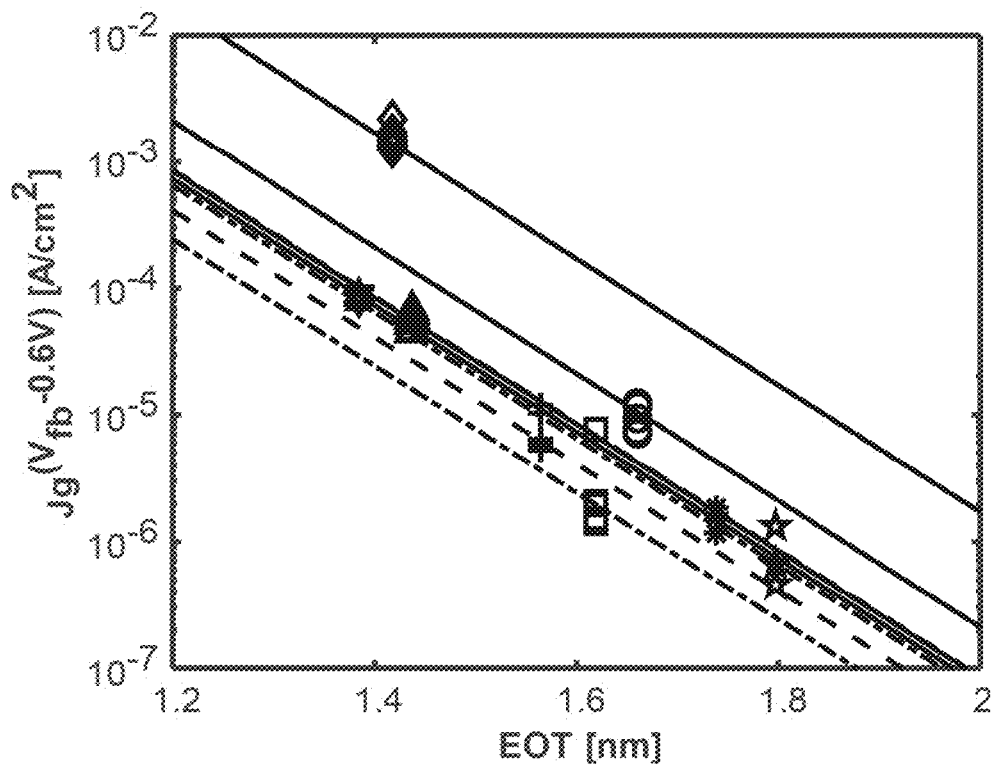
FIG. 18 is a graph showing the gate leakage density $J_g$ (sensed at $V_{fb}$-0.6 V) of the stacks with different ILs, in accordance with example embodiments.

FIG. 18 is a graph showing the gate leakage density $J_g$ (sensed at $V_{fb}$–0.6 V) of the stacks with different IL's: three thermal oxides grown at 600 (circle), 700 (triangle) and 900 (diamond) ° C. as references, an equivalent 700° C. thermal oxide that was further exposed to a post-metal 850° C. reliability anneal (six-pointed star), and four equivalent 600° C. thermal oxides exposed to different H* regimens—namely at 100° C. for 10" (plus), at 100° C. for 10' (asterisk) at 300° C. for 10" (square), and at 300° C. for 10' (five-pointed star)—, plotted vs. the EOT of the final stack. Dashed lines depict a typical $J_g$-EOT scaling trend (10× increase for 0.2 nm scaling). H* exposure always resulted in reduced $J_g$ compared to the 600° C. reference.

Figure 19:
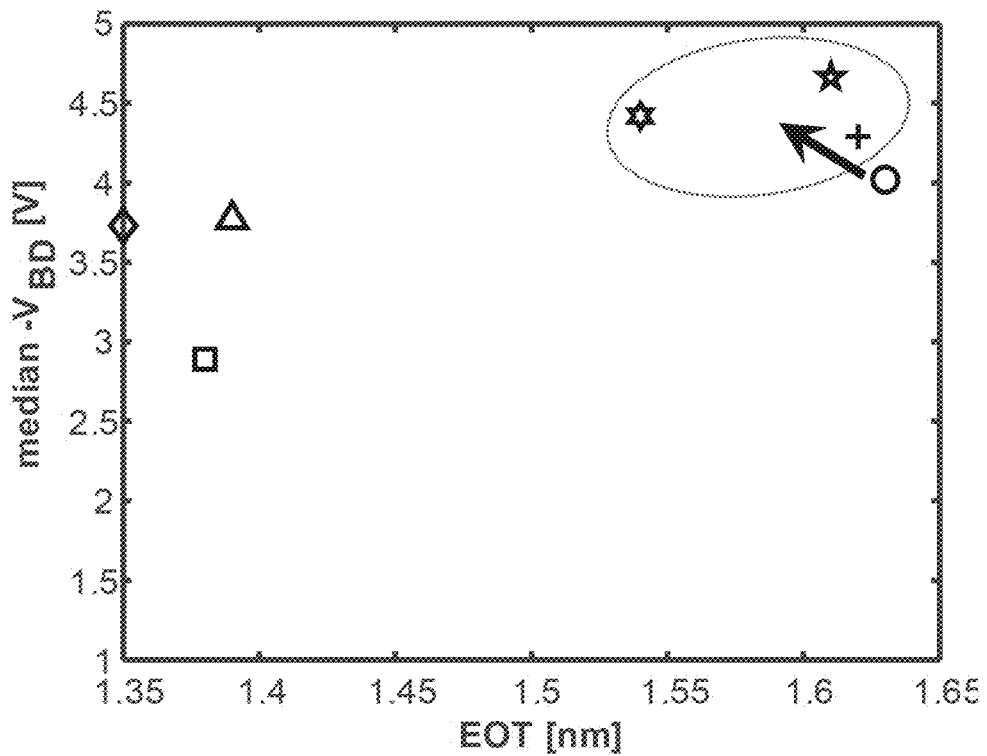
FIG. 19 is a plot showing the median $V_g$-to-breakdown measured in a set of 100 µm² capacitors with various gate stacks with different ILs, in accordance with example embodiments.

FIG. 19 is a plot showing the median $V_g$-to-breakdown measured in a set of 100 μm² capacitors with various gate stacks with different IL's: three thermal oxides grown at 600 (circle), 700 (triangle) and 900 (square) ° C. as references, an equivalent 700° C. thermal oxide that was further exposed to a post-metal 850° C. reliability anneal (diamond), and three equivalent 600° C. thermal oxides exposed respectively to H* at 100° C. for 10" (six-pointed star), to H* at 300° C. for 10" (five-pointed star), and to 20 atm $H_2$ at 450° C. for 2 h (plus), plotted vs. EOT. Exposing the 600° C. IL to $H_2$ or H* results in improved breakdown robustness.

Figure 20:
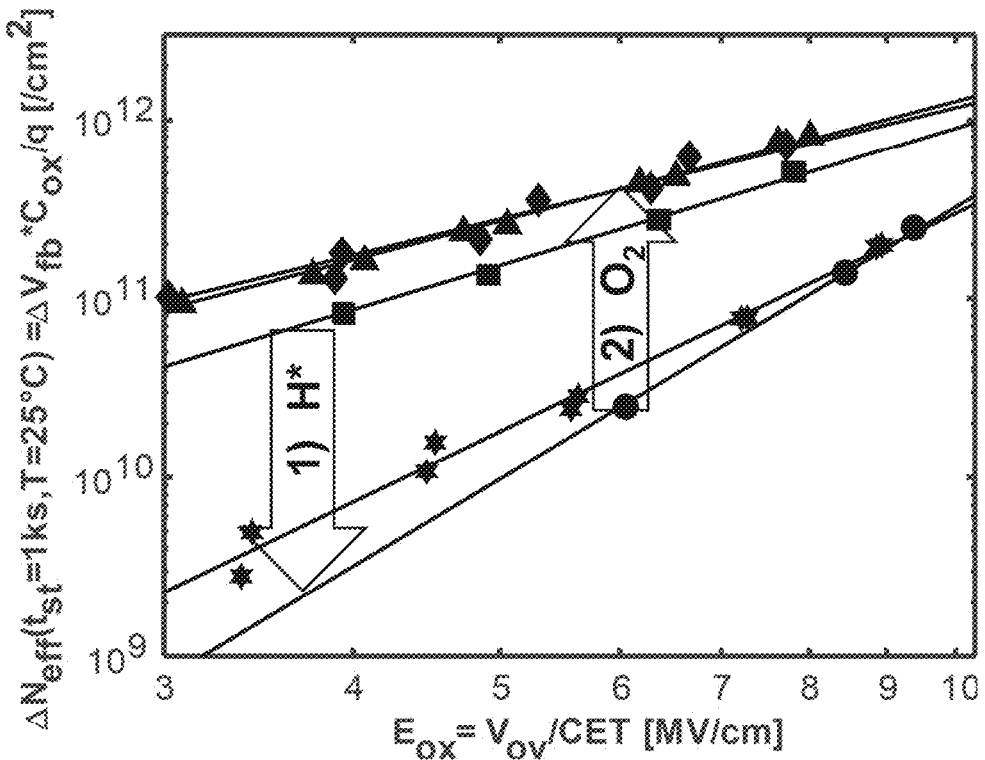
FIG. 20 is a graph showing NBTI-induced $\Delta N_{eff}$ vs. stress $E_{ox}$ for gate stacks with different IL's, in accordance with example embodiments.

FIG. 20 is a graph showing NBTI-induced $\Delta N_{eff}$ vs. stress $E_{ox}$ for gate stacks with different IL's: two thermal oxides (~1.2 nm) grown at 600 (square) and 900 (star) ° C., and three equivalent 600° C. thermal oxides that were further exposed before HKMG respectively to H* at 100° C. for 10' (circle), to H* at 100° C. for 10' and subsequently to 1 atm $O_2$ at 450° C. for 0.5 h (diamond), and to H* at 200° C. for 10" and subsequently to 1 atm $O_2$ at 450° C. for 0.5 h (diamond). The exposure to 1 atm $O_2$ induced re-oxidation of the Si surface at low temperature, which negates the NBTI improvement.

Figure 21:
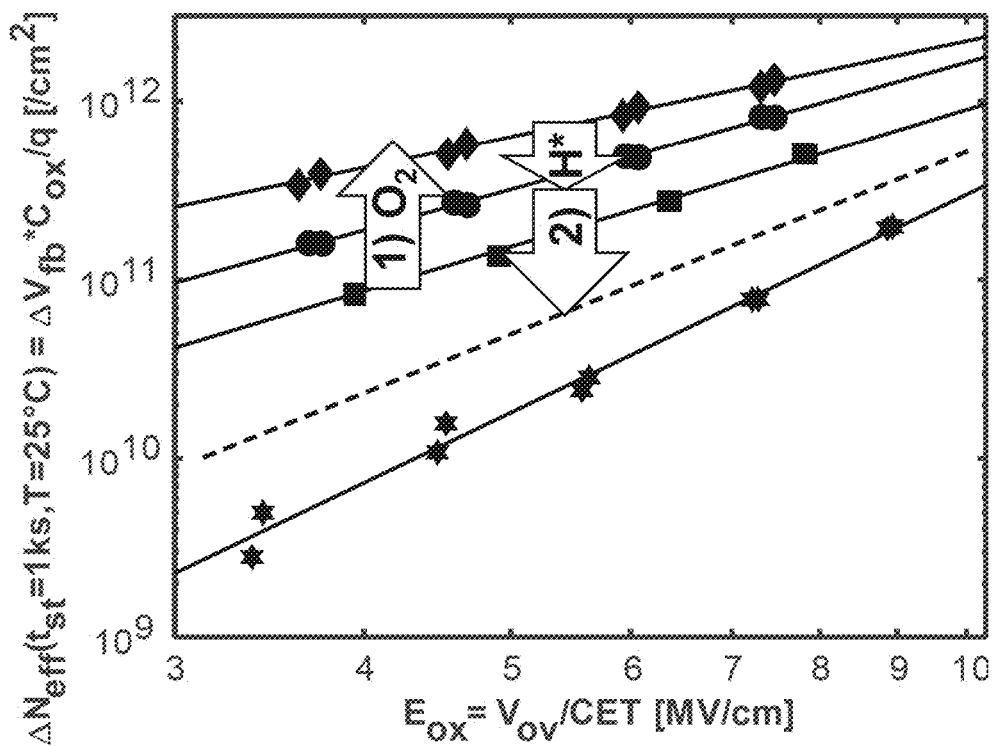
FIG. 21 is another graph showing NBTI-induced $\Delta N_{eff}$ vs. stress $E_{ox}$ for gate stacks with different IL's, in accordance with example embodiments.

FIG. 21 is a graph showing NBTI-induced $\Delta N_{eff}$ vs. stress $E_{ox}$ for gate stacks with different IL's: two thermal oxides (~1.2 nm) grown at 600 (square) and 900 (star) ° C., and two equivalent 600° C. thermal oxides that were further exposed before HKMG respectively to 20 atm $O_2$ at 450° C. for 0.5 h (diamond), and to 20 atm $O_2$ at 450° C. for 0.5 h and subsequently to H* at 300° C. for 10" (circle). The exposure to 20 atm $O_2$ induced an EOT regrowth of ~2 Å, resulting in further degraded NBTI; a subsequent exposure to H* (at 300° C. for 10") improves the reliability, which might be completely restored by longer exposures (e.g., 10'; dashed line).

Figure 22:
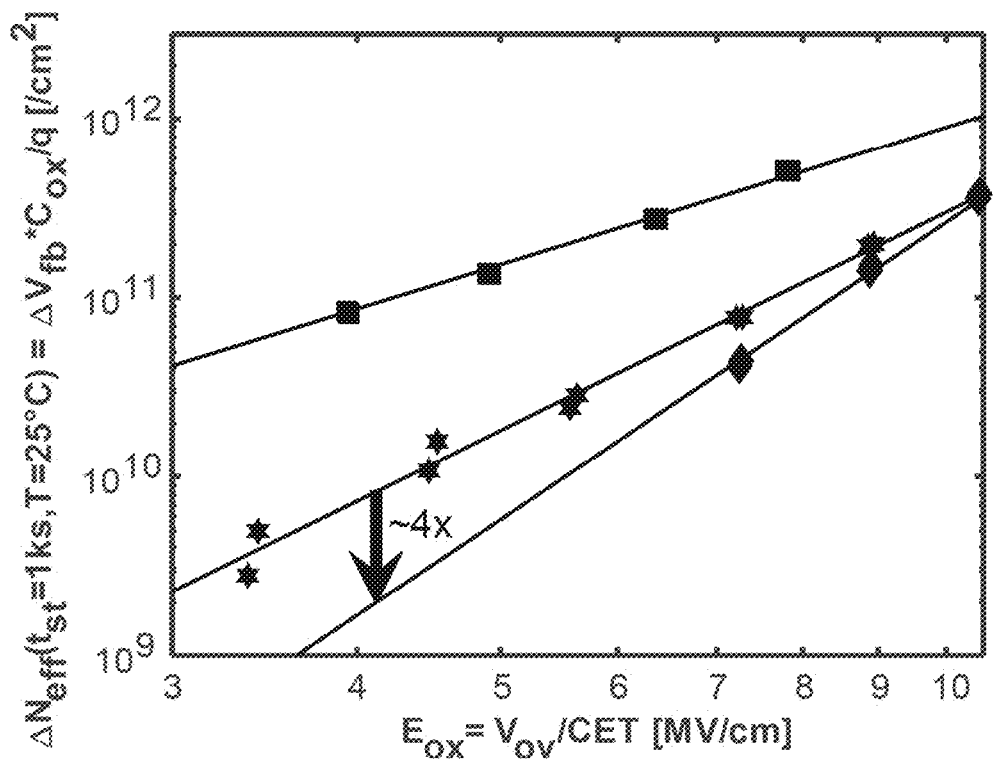
FIG. 22 is another graph showing NBTI-induced $\Delta N_{eff}$ vs. stress $E_{ox}$ for gate stacks with different IL's, in accordance with example embodiments.

FIG. 22 is a graph showing NBTI-induced $\Delta N_{eff}$ vs. stress $E_{ox}$ for gate stacks with different IL's: two thermal oxides (~1.2 nm) grown at 600 (square) and 900 (star) ° C., and an equivalent 900° C. thermal oxide that was further exposed before HKMG to H* at 300° C. for 10" (diamond). Exposing a 900° C. IL to H* (at 300° C. for 10") results in further reliability improvement.

FIG. 23 is a correlation plot of NBTI reliability (shown as the $V_{ov}$ necessary to reach a 2.5 mV shift after 1 ks stress at 25° C.) vs. the eWF for gate stacks with different IL's as previously described: a 600° C. thermal oxide (1), 600° C. thermal oxide further exposed to H* at 100° C. for 10" (2), 600° C. thermal oxide further exposed to H* at 300° C. for 10" (3), 600° C. thermal oxide further exposed to H* at 100° C. for 10' (4), 600° C. thermal oxide further exposed to H* at 300° C. for 10' (5), 600° C. thermal oxide further exposed to H* at 300° C. for 10" without (post-metal) sintering anneal in the presence of $H_2$ (6), 600° C. thermal oxide further exposed to H* at 100° C. for 10" and subsequently to 1 atm $O_2$ at 450° C. for 0.5 h (7), 600° C. thermal oxide further exposed to H* at 200° C. for 10" and subsequently to 1 atm $O_2$ at 450° C. for 0.5 h (8), 600° C. thermal oxide further exposed to 20 atm $H_2$ at 450° C. for 0.5 h (9), 600° C. thermal oxide further exposed to 20 atm $H_2$ at 450° C. for 2 h (10), 600° C. thermal oxide further exposed to 20 atm $O_2$ at 450° C. for 0.5 h (11), 600° C. thermal oxide further exposed to 20 atm $O_2$ at 450° C. for 2 h (12), 600° C. thermal oxide further exposed to 20 atm $O_2$ at 450° C. for 0.5 h and subsequently to H* at 300° C. for 10" (13), 700° C. thermal oxide (14), 700° C. thermal oxide further exposed to a reliability anneal at 850° C. (15), 900° C. thermal oxide (16), and 900° C. thermal oxide further exposed to H* at 300° C. for 10" (17). Stacks with improved reliability—i.e., with IL grown at a higher temperature, or exposed to $H_2$ or H*-always show an increased eWF (i.e., reduced positive charge, cf. FIG. 10). Note that the $V_{ov}$ improvement range (0.2→1.8V) is much larger than the eWF increase (4.73 eV→5.04 eV), which proves that the NBTI improvement is not solely due to fixed charge reduction (lower $E_{ox}$ at same $V_{ov}$).

Figure 24:
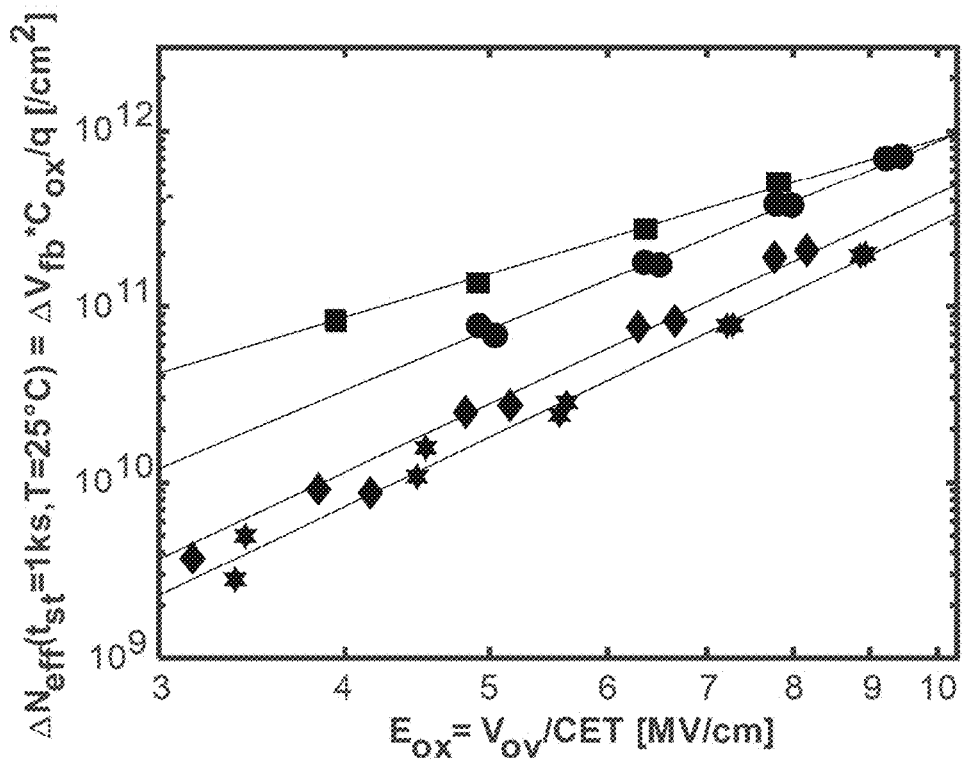
FIG. 24 is a graph showing NBTI-induced $\Delta N_{eff}$ vs. stress $E_{ox}$ for gate stacks with different IL's, in accordance with example embodiments.

FIG. 24 is a graph showing NBTI-induced $\Delta N_{eff}$ vs. stress $E_{ox}$ for gate stacks with different IL's: two thermal oxides (~1.2 nm) grown at 600 (square) and 900 (star) ° C., and two equivalent 600° C. thermal oxides that were further exposed before HKMG respectively to H* at 300° C. for 10" (diamond), and to H* at 300° C. for 10" but without post-metal sintering anneal in the presence of $H_2$. Omitting the final post-metal sintering (at 400° C. for 20' in 1 atm $H_2$) partially negates the improvement induced by IL exposure to H* (at 300° C. for 10"), and results in largertime-zero $D_{it}$ (inset, 2×10¹¹ vs. 4×10¹⁰/cm²/eV).

Figure 25:
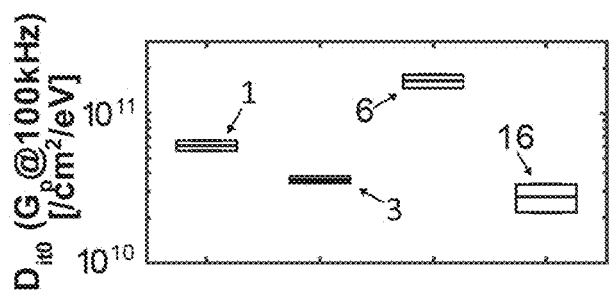
FIG. 25 is a box plot showing the time-zero $D_{it}$ (i.e., $D_{it0}$) of the final stack for different types of IL, with reference numbers as for FIG. 23, in accordance with example embodiments.

FIG. 25 is a box plot showing the time-zero $D_{it}$ (i.e. $D_{it0}$) the final stack for different types of IL, with reference numbers as for FIG. 23. Omitting the final post-metal sintering (cf. supra) results in larger $D_{it0}$ (2×10¹¹ vs. 4×10¹⁰/cm²/eV).

Figure 26:
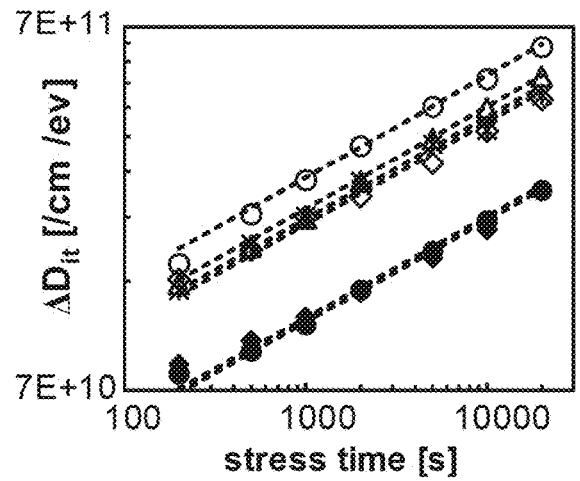
FIG. 26 is a graph showing NBTI-induced $D_{it}$ generation kinetics monitored by the parallel conductance peak in depletion during 125° C. stress at $E_{ox}$=5.7 MV/cm for gate stacks with different IL's, in accordance with example embodiments.

FIG. 26 is a graph showing NBTI-induced $D_{it}$ generation kinetics monitored by the parallel conductance peak in depletion (f=10 kHz) during 125° C. stress at $E_{ox}$=5.7 MV/cm for gate stacks with different IL's: three thermal oxides (~1.2 nm) grown at 600 (hollow circle), 700 (hollow diamond) and 900 (solid circle) ° C., an equivalent 700° C. thermal oxide that was further exposed after HKMG to a post-metal 850° C. 'reliability anneal' (solid diamond), an equivalent 600° C. thermal oxide that was further exposed before HKMG to a high pressure (20 atm) anneal at 450° C. in molecular $H_2$ for 2 h (cross) and an equivalent 600° C. thermal oxide that was further exposed before HKMG to H* for 10" at 300° C. (triangle). The same kinetics—with a slope of ~0.28—is observed irrespective of the IL treatment; exposure to $H_2$ or H* reduces the $\Delta D_{it}$ on the 600° C. IL stack, matching a 700° C. reference IL, while a more stable interface is observed in the 850-900° C. IL's.

Figure 27:
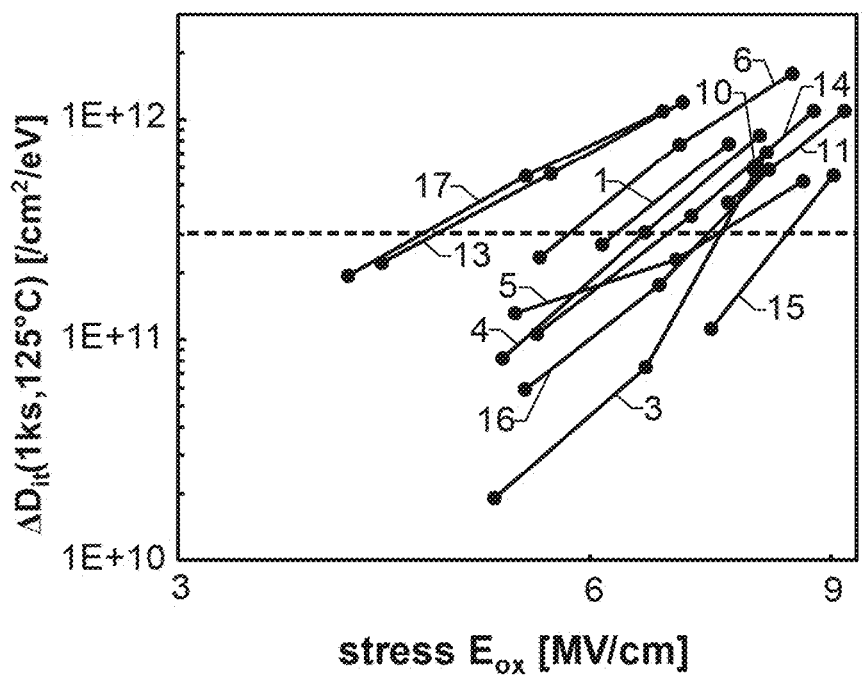
FIG. 27 is a graph showing NBTI-induced $\Delta D_{it}$ generation monitored on various gate stacks with reference numbers as for FIG. 23, by the parallel conductance peak in depletion (f=25 kHz) during stress at 125° C. and increasing $E_{ox}$, in accordance with example embodiments.

FIG. 27 is a graph showing NBTI-induced $\Delta D_{it}$ generation monitored on various gate stacks with reference numbers as for FIG. 23, by the parallel conductance peak in depletion (f=25 kHz) during stress at 125° C. and increasing $E_{ox}$.

Figure 28:
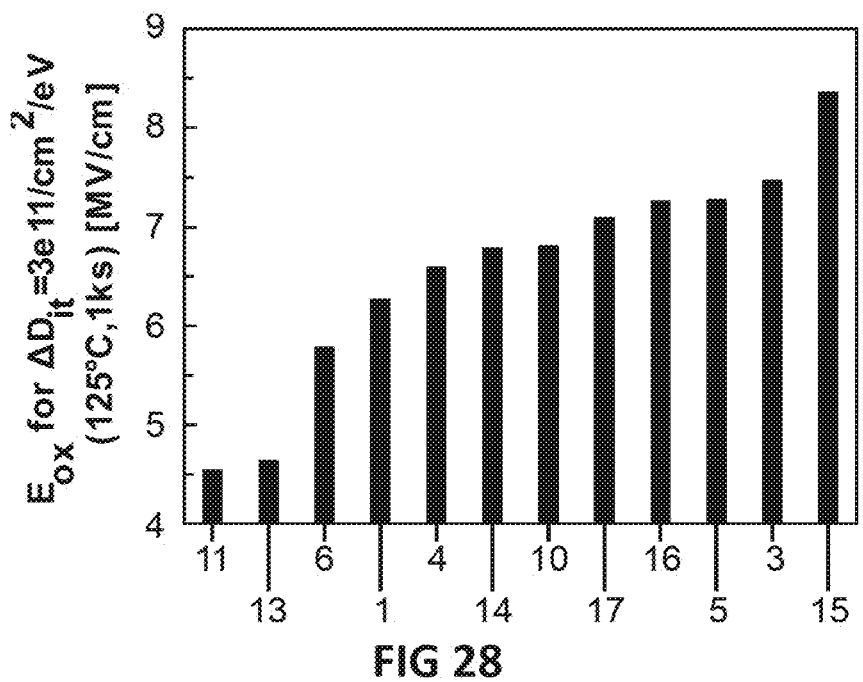
FIG. 28 is a bar chart showing estimated $E_{ox}$ to induce $\Delta D_{it}$=3×10¹¹ cm⁻² eV⁻¹ after 1 ks stress (cutline of FIG. 27) plotted vs. the stack configuration, from worst to best, in accordance with example embodiments.

FIG. 28 is a bar chart showing estimated $E_{ox}$ to induce $\Delta D_{it}=3\times10^{11}$ cm$^{-2}$ eV$^{-1}$ after 1 ks stress (cutline of FIG. 27) plotted vs. the stack configuration, from worst to best. Re-oxidation at 450° C. results in the poorest interface stability, which is instead substantially improved by increasing the oxidation T or exposing the (600° C.) IL to H* or HP (high pressure) $H_2$.

Figure 29:
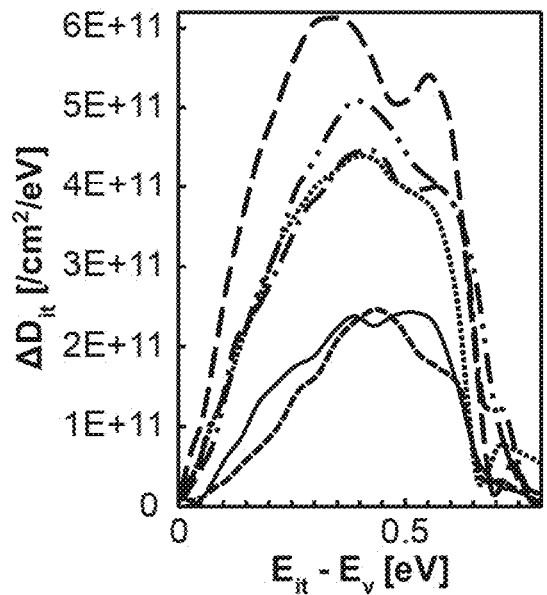
FIG. 29 is a graph of the $\Delta D_{it}(E)$ profile induced by 20 ks NBTI stress at $E_{ox}$=5.7 MV/cm and 125° C., as extracted from C-V stretch-out correction for gate stacks with different IL's, in accordance with example embodiments.

FIG. 29 is a graph of the $\Delta D_{it}(E)$ profile induced by 20 ks NBTI stress at $E_{ox}$=5.7 MV/cm and 125° C., as extracted from C-V stretch-out correction for gate stacks with different IL's: three thermal oxides (~1.2 nm) grown at 600 (long dash), 700 (dotted) and 900 (solid) ° C., an equivalent 700° C. thermal oxide that was further exposed after HKMG to a post-metal 850° C. 'reliability anneal' (short dash), an equivalent 600° C. thermal oxide that was further exposed before HKMG to a high pressure (20 atm) anneal at 450° C. in molecular $H_2$ for 2 h (dash-dot) and an equivalent 600° C. thermal oxide that was further exposed before HKMG to H* for 10" at 300° C. (dash-dot-dot).

Figure 30:
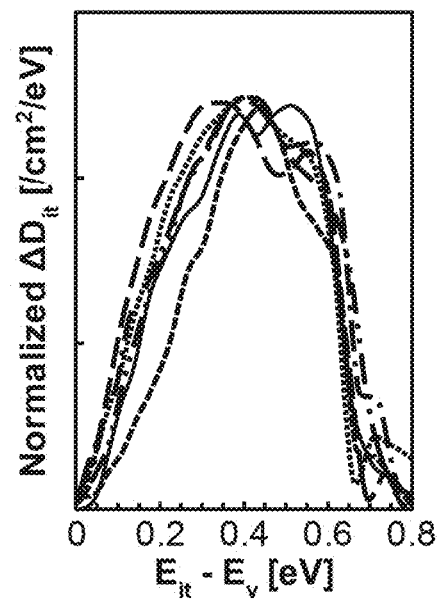
FIG. 30 is a graph of the $\Delta D_{it}(E)$ profile as in FIG. 29, normalized to the peak amplitudes, in accordance with example embodiments.

FIG. 30 is a graph of the $\Delta D_{it}(E)$ profile as in FIG. 29, normalized to the peak amplitudes.

Figure 31:
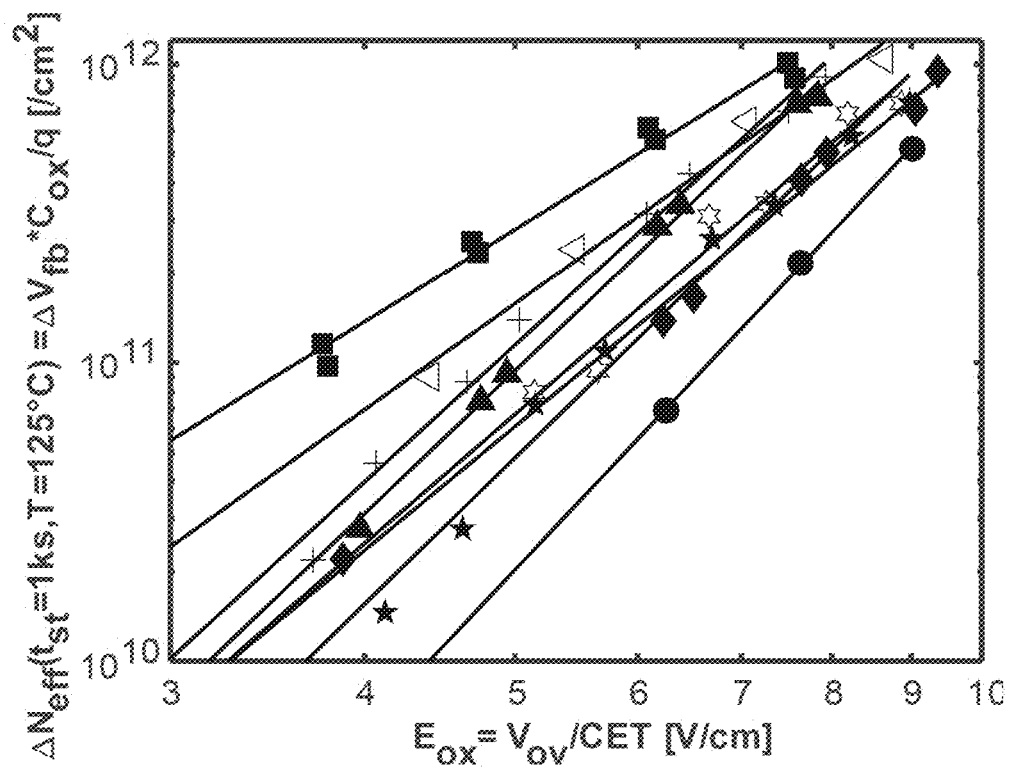
FIG. 31 is a graph showing NBTI-induced $\Delta N_{eff}$ vs. stress $E_{ox}$ after 1 ks stress, here at elevated stress temperature (125° C.) for gate stacks with different ILs, in accordance with example embodiments.

FIG. 31 is a graph showing NBTI-induced $\Delta N_{eff}$ vs. stress $E_{ox}$ after 1 ks stress, here at elevated stress temperature (125° C.) for gate stacks with different IL's: three thermal oxides (~1.2 nm) grown at 600 (square), 700 (hollow triangle) and 900 (hollow star) ° C., an equivalent 700° C. thermal oxide that was further exposed after HKMG to a post-metal 850° C. 'reliability anneal' (solid star), an equivalent 600° C. thermal oxide that was further exposed before HKMG to a high pressure (20 atm) anneal at 450° C. in molecular $H_2$ for 2 h (plus) and three equivalent 600° C. thermal oxides that were further exposed before HKMG to H* for respectively 10' at 100° C. (diamond), 10" at 300° C. (solid triangle) and 10' at 300° C. (circle). Exposing a 600° C. IL to H* (10', 100/300° C.) suppresses hole trapping (cf. FIG. 14), and also moderately reduces the $D_{it}$ generation (cf. FIG. 26-FIG. 30), yielding the best overall NBTI reliability, even with respect to a 900° C. IL or to a stack exposed to an 850° C. 'reliability anneal.'

Figure 32:
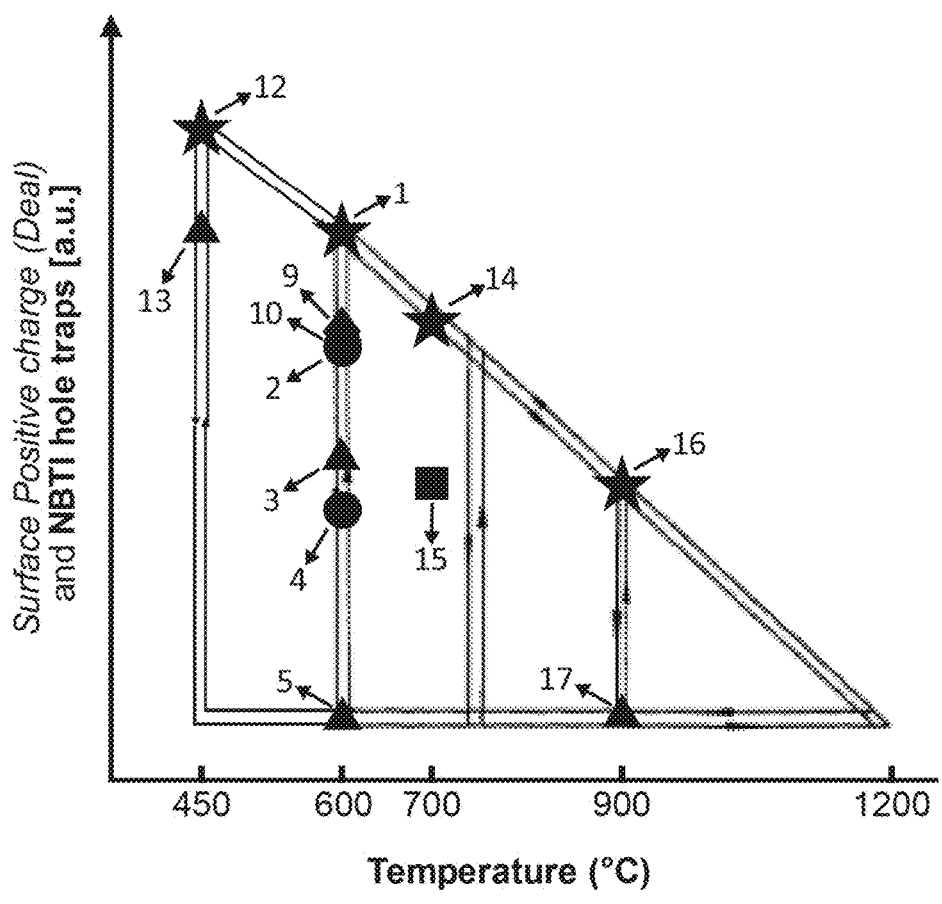
FIG. 32 is a graph of surface positive charge (Deal) and NBTI hole traps as a function of temperature with reference numbers as for FIG. 23, in accordance with example embodiments.

FIG. 32 is a graph of surface positive charge (Deal) and NBTI hole traps as a function of temperature with reference numbers as for FIG. 23; the different symbols reflect different (final) treatment/exposure temperatures: none (star), 100° C. (circle), 300° C. (triangle), 450° C. (diamond) or 850° C. (square). Example embodiments described herein extend the validity of the "Deal-triangle" from surface positive charge to NBTI reliability. Hole trapping in $SiO_2$ is controlled by oxidation temperature, with the last oxidation determining the charging trap density. After oxidation, hole traps can be passivated by H* at low temperature (100-300° C.) or—less effectively and at higher temperatures (450° C.)—by high pressure $H_2$.

EXAMPLE

Experimental

MOS capacitors were fabricated on a 300 mm test vehicle in an RMG flow. Different thermal $SiO_2$ ILs with a thickness of about 1.2 nm and grown at 600, 700 or 900° C. by ISSG (in situ steam generation) or RTO (rapid thermal oxidation) processes were considered. Additionally, similar experiments were performed on an ultrathin ~0.5 nm chemical oxide IL obtained by a wet cleaning on the Si surface was also considered; the results thereof are not discussed in detail herein, but suffice it to say that similar trends were observed for such ultrathin ILs as for the thermal oxides which are extensively discussed below. Treatments were performed on the IL right after formation. The gate stack was completed in all cases by depositing ~1.8 nm $HfO_2$ and 5 nm TiN by ALD (atomic layer deposition), and 60 nm W by ALD. Unless noted otherwise, a final sintering (at 400° C. for 20' in molecular $H_2$) was performed to passivate the Si/$SiO_2$ interface. For reference, one stack comprised a chemical oxide IL (~0.7 nm) and another stack (with a 700° C. IL) was exposed to a 'reliability anneal' (at 850° C. for 1.5" in He, after deposition of a sacrificial TiN/α-Si gate). In selected cases, after formation, the IL was exposed to atomic hydrogen generated in a remote plasma, or to $H_2$ (20 atm) and/or to $O_2$ (1 or 20 atm), as discussed in the next section. EOT (equivalent oxide thickness) and eWF (effective work function) were estimated from C-V curves measured on capacitor test structures with the CVC Hauser tool. NBTI was studied by stress/recovery sequences (minimum sense delay ~10 ms; stress times up to 1 ks) at increasing stress $E_{ox}\approx(V_g-V_{fb0})/(EOT+0.4$ nm)—with $E_{ox}$ the gate oxide electric field, $V_g$ the gate bias voltage and $V_{fb0}$ the flat-band voltage at time-zero (i.e., without degradation)—at 25° C. (to sense mainly the hole trapping component) and at 125° C. (to sense also the interface defects $D_{it}$ generation component, which becomes more visible at an elevated temperature within a limited stress measurement time). Degradation was benchmarked as the induced change in effective charge sheet density $\Delta N_{eff}\equiv\Delta V_{fb}\cdot C_{ox}/q$—with $N_{eff}$ the effective charge sheet density, $\Delta V_{fb}$ the NBTI-induced flat-band voltage shift, $C_{ox}$ the oxide capacitance and q the elementary charge. An additional set of NBTI stresses up to 20 ks was performed at 125° C., periodically interrupted to measure the C-f-V response to directly monitor $D_{it}$ generation from C-V stretch out correction or from the parallel conductance peak in depletion.

Results and Discussion

The so-called 'reliability anneal'—performed at about 850-900° C.—is a crucial step in RMG HKMG gate stack fabrication, but it is not compatible with stacked top tier fabrication. Omitting this post-metal anneal results in poor PBTI and NBTI reliability with induced threshold voltage ($V_{th}$) shifts ~10× larger compared to the Foundry 28 nm process from Franco et al. (2018) (FIG. 1). The imec/T.U. Wien BTI modeling framework Comphy (RZEPA, Gerhard, et al. Comphy—A compact-physics framework for unified modeling of BTI. *Microelectronics Reliability*, 2018, 85: 49-65.) was used to estimate the hole trap energy levels within the $SiO_2$ bandgap, and to compare with ab initio calculations of the charge transition levels of known $SiO_2$ defect structures (FIG. 4-FIG. 6). The often-invoked oxygen vacancies show too deep charge transition levels to be of relevance for the NBTI reliability of low voltage Logic technologies. In contrast, the hydroxyl-E' (i.e., a hydroxyl-group replacing an oxygen) and hydrogen bridge (i.e., a hydrogen replacing an oxygen) structures (FIG. 5-FIG. 6) are expected to have charge transition levels in the vicinity of Si valence band edge ($E_v$) and are, therefore, compatible with the observed experimental NBTI signature. In particular, the hydroxyl-E' tends to form in the presence of stretched Si—O bonds. To investigate the role of oxidation temperature on the hole trap formation, the NBTI reliability of stacks was compared with various ILs (FIG. 7): a strong dependence is observed, with the IL grown at the highest temperature (900° C.) showing the best reliability. Note that performing an 850° C. post-metal 'reliability anneal' yields a trap density as low as the one measured on a 900° C. IL, suggesting a key role of the last oxidation temperature. The dependence of the hole trap density on the oxidation temperature matches well the stretched Si—O FTIR (Fourier-transform infrared spectroscopy) signal reported by San Andrés et al. (SAN ANDRÉS, E., et al. Rapid thermal annealing effects on the structural properties and density of defects in SiO 2 and SiN x: H films deposited by electron cyclotron resonance. *Journal of Applied Physics*, 2000, 87.3: 1187-1192.) (FIG. 8). These initial observations suggest the qualitative model depicted in FIG. 9-FIG. 10: a reduced oxidation temperature does not allow for a complete relaxation of strain at the Si/SiO$_2$ interface, resulting in a larger presence of stretched Si—O bonds, which are precursors for hydroxyl-E' formation. As a consequence, the hole trap and fixed positive charge densities depend on the oxidation temperature (FIG. 10), where the hole trap band tail reaching above Si E$_v$ is perceived as an additional fixed charge, as it would be positively charged already at flat-band. While formation of these defects is an unavoidable consequence of thermodynamics, we demonstrate that these specific types of hole traps can be passivated after IL formation at low temperature by proper hydrogen treatments.

The hydroxyl-E' was suggested as an NBTI-inducing defect already in 1995, and has been recently extensively studied in the context of RTN (random telegraph noise)/NBTI kinetics models by Grasser et al. (GRASSER, Tibor, et al. On the volatility of oxide defects: Activation, deactivation, and transformation. In: 2015 *IEEE International Reliability Physics Symposium*. IEEE, 2015. p. 5A. 3.1-5A. 3.8.). FIG. 14 therein shows a diagram of four hydroxyl-E' configurations to model NBTI kinetics: the Si dangling bond (1 and 1' configurations) loses its electron upon hole capture, yielding the positive meta-stable (2') and stable (2) configurations. By various interactions with hydrogen, the defect can transform into a precursor state (left).

The possibility of preferentially inducing defect 'volatility' during the fabrication process was therefore envisioned by directly exposing the IL to hydrogen. Density-functional theory calculations suggest that exposure to atomic hydrogen can yield spontaneous passivation of the Si-dangling bond at the hydroxyl-E' and hydrogen bridges sites through the reactions:

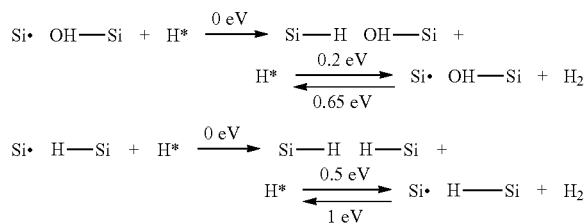

Alternatively, removal of the sticking hydrogen (over a thermal barrier) by dimerization and H$_2$ molecule release could also de-activate the defects: the hydroxyl-E' would tend to reform a correct Si—O—Si bond, while the hydrogen bridge (FIG. 11) would transform into an oxygen vacancy not contributing to NBTI (cf. FIG. 4-FIG. 5). Note that: (i) hydrogen species might also activate defects at precursor sites, and, therefore, properly controlling the exposure conditions to favorably skew the reaction balance can be beneficial, (ii) similar passivating reactions could also be induced by exposure to molecular hydrogen, though over sizeable energy barriers. Consistently, we could only achieve marginal 2-3×NBTI improvement when exposing a 600° C. IL to molecular hydrogen for up to 2 h at 450° C., despite resorting to 20 atm pressure to maximize H$_2$ availability (FIG. 13).

We, therefore, designed a remote hydrogen plasma process (FIG. 12) to expose the IL to hydrogen radicals (H*). As suggested by theory, this results in a very effective passivation of the hole traps (FIG. 14): a dramatic NBTI improvement is observed (~2-20× for 10"-10' exposures at 100° C., and ~7-100× at 300° C.) due to the suppression of the hole trap density down to or below the level of a 900° C. reference IL. By comparing the trap density reduction factors observed for the different exposures, an effective thermal barrier of 0.21±0.06 eV is estimated for the beneficial reaction(s) taking place at the defect sites (FIG. 15). We note that the short H* exposures do not result in any EOT increase, while a marginal increase of 1-1.5 Å was observed for the 10' exposures at 100-300° C.; however, it was found that this can be controlled/suppressed by for instance using subsequently (e.g., directly after the H* exposure) an additional H$_2$ anneal (e.g., at ~400° C.)—cf infra. In contrast, a gradual increase of the eWF is consistently observed for all the H* exposures (FIG. 16-FIG. 17), suggesting concurrent suppression of both hole traps and positive oxide charge (cf. FIG. 10). Moreover, the H* exposures results in reduced gate leakage (FIG. 18) and improved breakdown robustness (FIG. 19).

Performing an additional anneal in oxygen (450° C. for 0.5 h under 1 atm O$_2$) after exposing the 600° C. IL to H* results again in very poor NBTI reliability (FIG. 20). This suggests that additional oxidation of the Si surface (now at 450° C., instead of the original 600° C. oxidation) increases the near-interface defect density again. To prove the reversibility of the defect formation/passivation with H* processes, we first expose the 600° C. IL to a high-pressure oxygen anneal (450° C. for 0.5 h under 20 atm O$_2$), which induces ~2 Å oxide regrowth: this procedure yields the worst NBTI reliability, which is nevertheless improved again by subsequent H* exposure (FIG. 21). Conversely, even a high-quality 900° C. IL is further improved by H* (FIG. 22), suggesting this treatment can be beneficial (although not strictly necessary) also in a standard high thermal budget fabrication flow.

Across all the IL growth/treatment combinations studied, a remarkable correlation between the NBTI reliability and the eWF is consistently observed (FIG. 23), as postulated by our initial qualitative model (cf. FIG. 9-FIG. 10): the IL's grown at the lowest T (450° C.) show the lowest maximum-allowed gate overdrive voltage $V_{ov}$ for sufficient NBTI reliability (~0.2 V) and also the lowest eWF (~4.73 eV despite the use of a high WF TiN gate); increasing the oxidation temperature or exposing the stack to a 'reliability anneal' enhances both the max $V_{ov}$ and the eWF; similarly, both the H$_2$ and H* treatments (the latter most effectively) enhance the max $V_{ov}$ up to 1.8 V and eWF up to 5.04 eV along the same trend.

A possible detrimental effect of H* exposure is the de-passivation of Si—H bonds at the Si/SiO$_2$ interface. However, this is readily solved by performing a standard sintering anneal (e.g., at 400° C. for 20' in H$_2$) (directly) after the H* exposure and/or at the end of the RMG flow. Without being bound by theory, it is believed that such a sintering anneal immediately re-passivates dangling bonds (Pb's) at the Si surface, also resulting in an improved EOT stability (cf. supra). Omitting the latter after H* exposure of the IL (FIG. 24) results indeed in poor interface passivation (time-zero interface defects, i.e., without NBTI-induced degradation, $D_{it,0}$~2×10$^{11}$/cm$^2$/eV), and in a less improved NBTI reliability. To investigate interface stability, additional NBTI stresses were performed at elevated temperatures (125° C.), and $D_{it}$ generation was monitored by the parallel conductance in depletion. FIG. 26 reports the $D_{it}$ generation kinetics measured at accelerated stress conditions ($E_{ox}$=5.7 MV/cm) in selected stacks. In all cases, similar time-dependences are observed: H*, high pressure $H_2$ or exposure of the 600° C. IL results in improved interface stability, comparable to a 700° C. IL, although not as good as 900° C. or 850° C.-exposed IL's. The field-acceleration of the $D_{it}$ generation for various gate stack configurations is reported in FIG. 27-FIG. 28: a beneficially stronger field-acceleration is observed with H* exposure, resulting in smaller degradation at operating $E_{ox}$. Moreover, the energy profile of the NBTI-generated $D_{it}$ appears similar in all stacks (FIG. 29-FIG. 30), ruling out the formation of different types of interface states as a potential consequence of H* exposure.

To understand the NBTI reliability improvement demonstrated with H* exposure further, Comphy models were calibrated for all the studied gate stacks. $D_{it}$ generation was first calibrated based on the conductance peak increase with stress; a hole trap defect band was then included and calibrated to accurately reproduce the measured NBTI stress/recovery traces. The models were used here to visualize the reduction in hole trap density induced by increasing the oxidation temperature, or by treating the IL with hydrogen: H* exposure was observed to yield the lowest density of hole traps in the vicinity of Si $E_v$ (i.e., it resulted in the least detrimental defect band), and as a consequence to yield the best overall NBTI reliability, even when compared with conventional high-temperature (e.g., 900° C.) IL's at elevated stress temperature (FIG. 31).

SUMMARY

Excessive hole trapping limits the NBTI reliability of low temperature $SiO_2$ ILs. The NBTI dependence on the (last) IL oxidation temperature was correlated to unrelaxed interface strain, which induces excessive formation of hydrogen-related hole traps (hydroxyl-E'). By combining experimental observations with theoretical insights, a low temperature (100-300° C.) atomic hydrogen treatment was developed, which dramatically reduces the density of hole traps, yielding an oxide quality superior to a 900° C. reference IL. A correlation between NBTI reliability and positive oxide charges was established, ascribing the latter also to the tail of the $SiO_2$ hole trap defect band reaching above Si $E_v$. These insights extend the validity of the 'Deal triangle' of oxidation (DEAL, Bruce E., et al. Characteristics of the surface-state charge (Qss) of thermally oxidized silicon. *Journal of the Electrochemical Society*, 1967, 114.3: 266.) also to NBTI reliability (FIG. 32), and facilitate the fabrication of high quality $SiO_2$ at low temperatures by controlling the hydrogen dynamics, which represents a breakthrough for stacked CMOS tier fabrication.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for improving a bias temperature instability of a $SiO_2$ layer, the method comprising:
    exposing the $SiO_2$ layer to atomic hydrogen from a remote plasma source, wherein the exposure is at a low first temperature; and
    after exposure to atomic hydrogen, sintering the $SiO_2$ layer in a presence of molecular hydrogen at a second temperature, wherein the second temperature is greater than the low first temperature.

2. The method according to claim 1, wherein exposing the $SiO_2$ layer to atomic hydrogen is performed at a temperature between 100 and 300° C.

3. The method according to claim 2, wherein exposing the $SiO_2$ layer to atomic hydrogen is performed for a duration of between 10 s and 10 min.

4. The method according to claim 3, wherein exposing the $SiO_2$ layer to atomic hydrogen comprises exposing the $SiO_2$ layer to atomic hydrogen from a remote plasma.

5. The method according to claim 4, wherein before exposing the $SiO_2$ layer to atomic hydrogen, the method comprises:
    growing the $SiO_2$ layer at a temperature of 600° C. or lower.

6. The method according to claim 5, wherein the $SiO_2$ layer has not been exposed to a temperature of more than 300° C.

7. The method according to claim 1, wherein exposing the $SiO_2$ layer to atomic hydrogen is performed for a duration of between 10 s and 10 min.

8. The method according to claim 1, wherein exposing the $SiO_2$ layer to atomic hydrogen comprises exposing the $SiO_2$ layer to atomic hydrogen from a remote plasma.

9. The method according to claim 1, wherein before exposing the $SiO_2$ layer to atomic hydrogen, the method comprises:
    growing the $SiO_2$ layer at a temperature of 600° C. or lower.

10. The method according to claim 1, wherein the $SiO_2$ layer has not been exposed to a temperature of more than 300° C.

11. The method according to claim 10, wherein sintering the $SiO_2$ layer is performed at a temperature between 300° C. and 500° C.

12. The method according to claim 10, wherein sintering the $SiO_2$ layer is performed for a duration of between 15 and 25 min.

13. The method according to claim 1, wherein the $SiO_2$ layer has a thickness between 0.5 and 2.5 nm.

14. A method for forming a $SiO_2$ layer for a metal-oxide-semiconductor, the method comprising:
    depositing a $SiO_2$ layer, and
    improving a bias temperature instability of the $SiO_2$ layer using the method according to claim 1.

15. The method according to claim 14, wherein the metal-oxide-semiconductor is a p-type metal-oxide-semiconductor.

* * * * *